US011495268B1

(12) United States Patent
Chiang

(10) Patent No.: US 11,495,268 B1
(45) Date of Patent: Nov. 8, 2022

(54) ASSEMBLY MODULE AND EXPANSION EQUIPMENT

(71) Applicant: Wistron Corporation, New Taipei (TW)

(72) Inventor: Chun-Yi Chiang, New Taipei (TW)

(73) Assignee: WISTRON CORPORATION, New Taipei (TW)

( * ) Notice: Subject to any disclaimer, the term of this patent is extended or adjusted under 35 U.S.C. 154(b) by 0 days.

(21) Appl. No.: 17/528,228

(22) Filed: Nov. 17, 2021

(30) Foreign Application Priority Data

Aug. 31, 2021 (TW) .................................. 110132363

(51) Int. Cl.
*G11B 33/02* (2006.01)

(52) U.S. Cl.
CPC .................................. *G11B 33/027* (2013.01)

(58) Field of Classification Search
None
See application file for complete search history.

(56) References Cited

U.S. PATENT DOCUMENTS

| 6,603,664 | B1 * | 8/2003 | Gallarelli | G06F 1/183 |
| | | | | 361/740 |
| 2003/0171022 | A1 * | 9/2003 | Distad | G02B 6/4261 |
| | | | | 439/372 |
| 2004/0057219 | A1 * | 3/2004 | Gallarelli | G06F 1/18 |
| | | | | 361/755 |
| 2007/0258224 | A1 * | 11/2007 | Fang | H05K 7/1409 |
| | | | | 361/759 |
| 2011/0128681 | A1 * | 6/2011 | Liu | H01M 50/209 |
| | | | | 74/25 |
| 2013/0147324 | A1 * | 6/2013 | Chen | G06F 1/181 |
| | | | | 312/223.1 |
| 2017/0191292 | A1 * | 7/2017 | Chen | E05C 1/065 |
| 2017/0196107 | A1 * | 7/2017 | Chen | H05K 7/1417 |

FOREIGN PATENT DOCUMENTS

| CN | 104977997 A | * | 10/2015 | ........... H05K 7/1487 |
| TW | 201441868 A | | 11/2014 | |
| TW | 566457 U | * | 9/2018 | ......... E05B 73/0082 |

OTHER PUBLICATIONS

Examination report dated Jan. 22, 2022, listed in related Taiwan patent application No. 110132363.

* cited by examiner

*Primary Examiner* — William J Klimowicz
(74) *Attorney, Agent, or Firm* — McClure, Qualey & Rodack, LLP

(57) ABSTRACT

An assembly module is applicable to a casing of an expansion equipment. The assembly module includes a transmission component and an operating member. The transmission component is disposed in the casing. The transmission component includes a rotary member, a connecting member, and a buckle member. The rotary member is pivotally connected to the casing. The connecting member is connected between the rotary member and the buckle member. A part of the buckle member is exposed from a buckle hole of the casing. The operating member is disposed on the casing, and is connected to the transmission component. The operating member is configured to drive the transmission component, so that a part of the buckle member is movably disposed in the buckle hole of the casing.

19 Claims, 19 Drawing Sheets

ASSEMBLY MODULE AND EXPANSION EQUIPMENT

CROSS-REFERENCE TO RELATED APPLICATION

This non-provisional application claims priority under 35 U.S.C. § 119(a) to Patent Application No. 110132363 filed in Taiwan, R.O.C. on Aug. 31, 2021, the entire contents of which are hereby incorporated by reference.

BACKGROUND

Technical Field

The present disclosure relates to a fixing structure, and in particular, to an assembly module.

Related Art

Electronic apparatuses are generally fixed to electronic devices in the market by using a fixing structure. For example, a hard disk, a compact disc-read only memory, or a display card is fixed to a computer by using a support, or a touch panel is cemented in a smart phone by using a substrate.

Since conventional electronic apparatuses are generally installed in electronic devices by using a fixing structure, the electronic apparatuses are difficult to replace.

SUMMARY

In view of the foregoing, in some embodiments, an expansion equipment is provided. The expansion equipment includes a casing and an assembly module. A buckle hole is provided in the casing. The assembly module includes a transmission component and an operating member. The transmission component is disposed in the casing, and includes a rotary member, a connecting member, and a buckle member. The rotary member is pivotally connected to the casing. The connecting member is connected between the rotary member and the buckle member. A part of the buckle member is exposed from the buckle hole. The operating member is disposed on the casing, and is connected to the transmission component. The operating member is configured to drive the transmission component, so that the part of the buckle member is movably disposed in the buckle hole.

Therefore, according to some embodiments, the operating member disposed in the casing drives the transmission component, so that the part of the buckle member is movable in the buckle hole of the casing, and the assembly module can perform assembling or disassembling. Therefore, a user does not need to reach inside the casing. In this way, the disassembling/assembling process is simplified. Thus, the assembly module is configured to assemble the expansion equipment onto or disassemble the expansion equipment from the electronic device by means of the linkage between the operating member and the transmission component.

DETAILED DESCRIPTION

Figure 1:
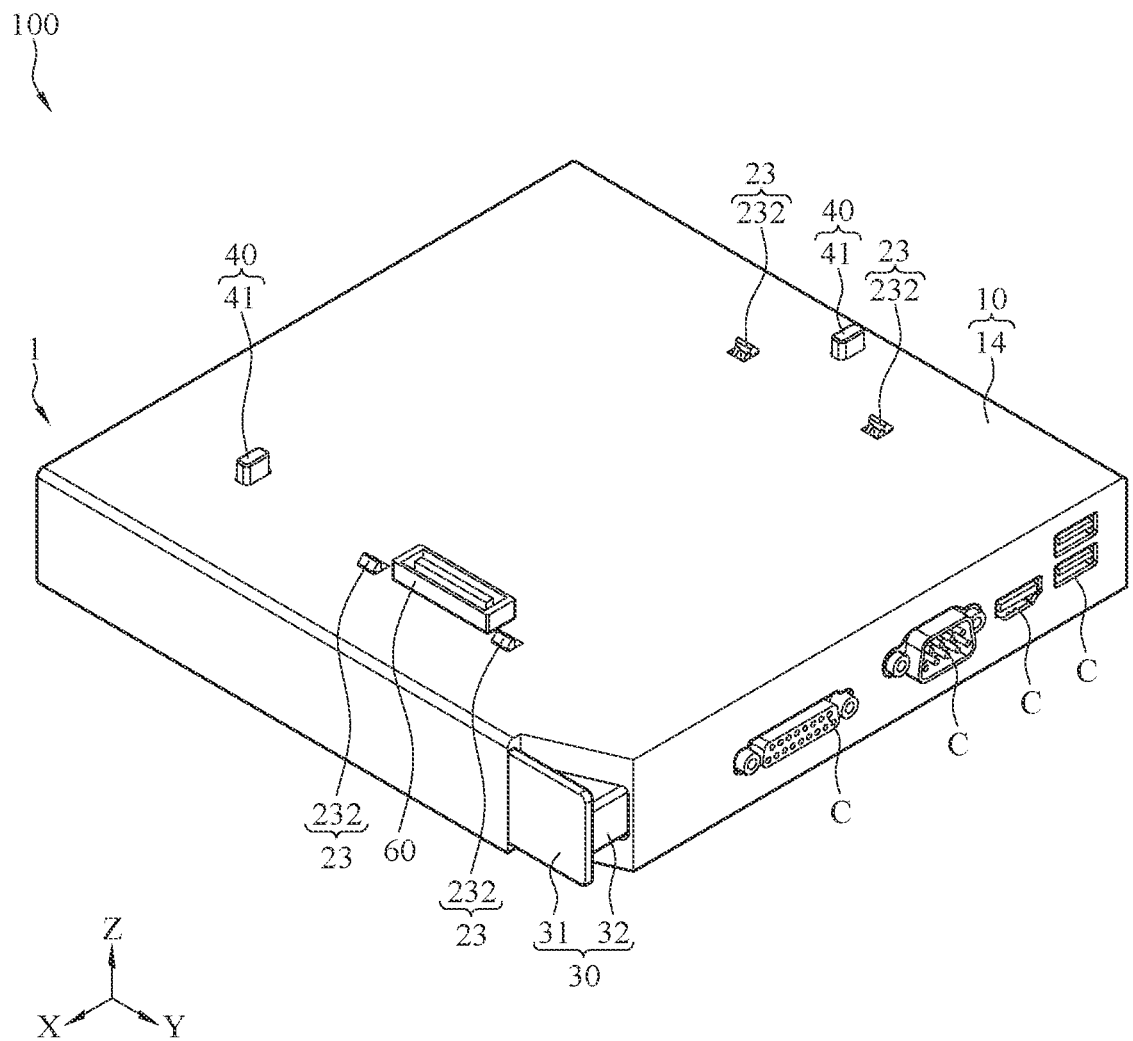
FIG. 1 illustrates a schematic diagram of an appearance of an expansion equipment according to some embodiments.

FIG. 1 illustrates a schematic diagram of an appearance of an expansion equipment 100 according to some embodiments. As shown in FIG. 1, in some embodiments, the expansion equipment 100 includes an assembly module 1. The expansion equipment 100 may be assembled to an electronic device by using the assembly module 1, to be electrically connected to the electronic device, so as to expand the functions of the electronic device. For example, the electronic device may be a thin client, a smart mobile phone, or a tablet computer.

Based on the above, as shown in FIG. 1, for example, in some embodiments, the expansion equipment 100 is an expansion base. The expansion equipment 100 includes a plurality of electrical interfaces C, so as to increase a quantity of electrical interfaces C of the electronic device. In some embodiments, the expansion equipment 100 may also be a hard disk drive (HDD), an optical disc drive, a touch panel, or a graph card, to expand a memory function, a reading function, or a display function of the electronic device.

Figure 2:
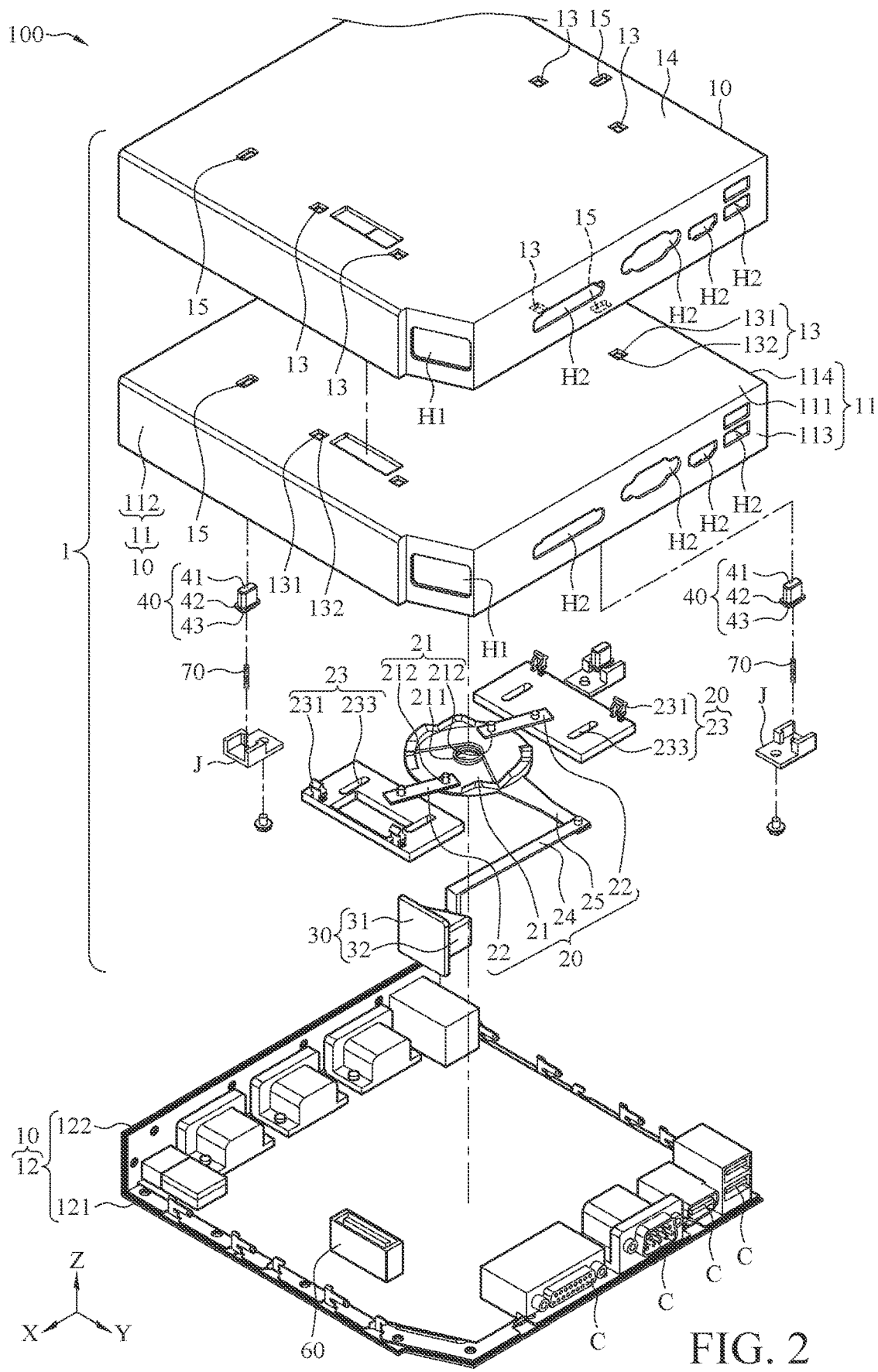
FIG. 2 illustrates a schematic exploded view of the expansion equipment according to some embodiments.

FIG. 2 illustrates a schematic exploded view of the expansion equipment 100 according to some embodiments. As shown in FIG. 2, in some embodiments, the expansion equipment 100 includes a casing 10. A buckle hole 13 is provided on the casing 10. In some embodiments, the expansion equipment 100 is used in combination with the assembly module 1. The assembly module 1 includes a transmission component 20 and an operating member 30. The transmission component 20 is disposed in the casing 10. The transmission component 20 includes a rotary member 21, a connecting member 22, and a buckle member 23. The rotary member 21 is pivotally connected to the casing 10. The connecting member 22 is connected between the rotary member 21 and the buckle member 23. A part of the buckle member 23 is exposed from the buckle hole 13. The part of the buckle member 23 may be a buckle part 232. The operating member 30 is located outside the casing 10. The operating member 30 is connected to the transmission component 20. The operating member 30 is configured to drive the transmission component 20, so that the part of the buckle member 23 is movably disposed in the buckle hole 13.

Therefore, a user may operate the operating member 30 disposed in the casing 10 to drive the transmission component 20, so that the part of the buckle member 23 is movable in the buckle hole 13, and the assembly module 1 can perform assembling or disassembling. Therefore, the user does not need to reach inside the casing 10. In this way, the disassembling/assembling process is simplified. Thus, the assembly module 1 is configured to assemble the expansion equipment 100 onto or disassemble the expansion equipment from the electronic device by means of the linkage between the operating member 30 and the transmission component 20.

Figure 3:
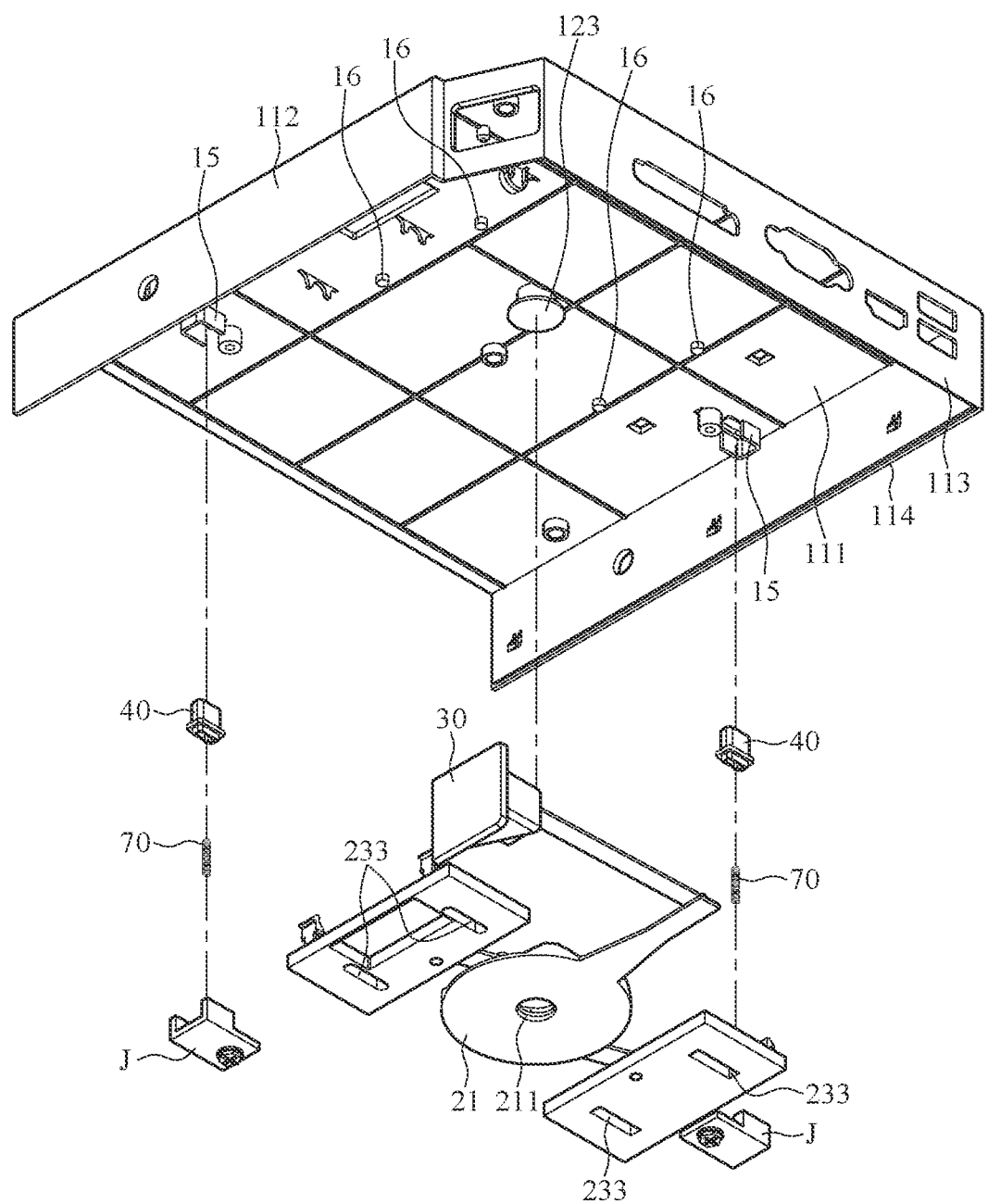
FIG. 3 illustrates a schematic exploded bottom view of partial components of the expansion equipment according to some embodiments.
Figure 5:
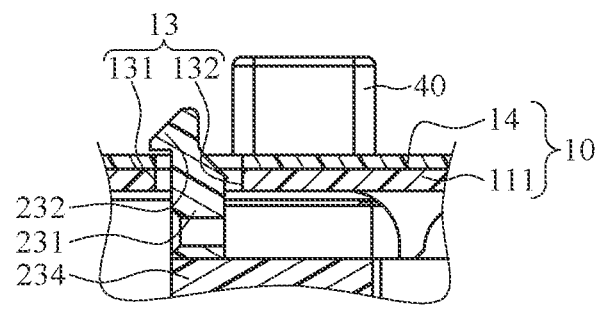
FIG. 5 illustrates a partial schematic cross-sectional view of the assembly module according to some embodiments, in which a buckle member is not in operation.
Figure 9:
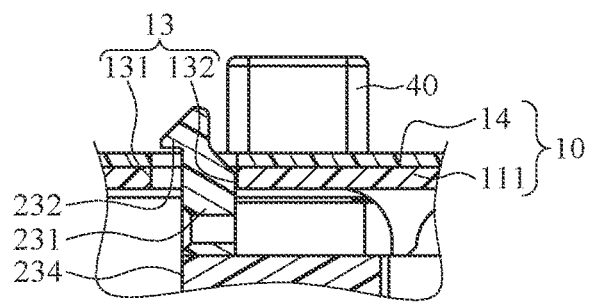
FIG. 9 illustrates a partial schematic cross-sectional view of the assembly module according to some embodiments, in which the buckle member is in operation.

In some embodiments, the part of the buckle member 23 may be exposed from the buckle hole 13. That is to say, the part of the buckle member 23 is formed by the buckle member 23 by passing through the buckle hole 13 to be away from the casing 10. Therefore, the part of the buckle member 23 is located outside the casing 10, as shown by a relationship between the buckle part 232 of the buckle member 23 and the buckle hole 13 in FIG. 2 and FIG. 9 (details of the FIG. 9 are described later), for example. In some embodiments, the part of the buckle member 23 is movably disposed in the buckle hole 13. That is to say, the part of the buckle member 23 is inserted through the buckle hole 13 and may be moved toward a hole edge of the buckle hole 13, as shown by a relationship between the buckle part 232 of the buckle member 23 and the buckle hole 13 in FIG. 2 and FIG. 5 (details of the FIG. 5 are described later), for example. FIG. 3 illustrates a schematic exploded bottom view of partial components of the expansion equipment 100 (shown in FIG. 2) according to some embodiments. As shown in FIG. 1 to FIG. 3, in some embodiments, the casing 10 includes a shielding housing 14, a casing cover 11, a base casing 12, an accommodating hole H1, a penetrating hole 15, a plurality of openings H2, and a first sliding rail portion 16.

Based on the above, in some embodiments, the casing cover 11 is located between the base casing 12 and the shielding housing 14. The casing cover 11 is disposed corresponding to the base casing 12. The shielding housing 14 covers the casing cover 11. In some embodiments, the casing cover 11 may be made of metal. The shielding housing 14 may be made of plastic. Thus, when the casing 10 is impacted, the casing cover 11 may cushion a momentum generated by the impact, and elements inside the casing 10 may be protected by the base casing 12.

In some embodiments, the casing cover 11 and the base casing 12 of the casing 10 may be separated components. Each separated component is made of metal integrally by means of casting, molding, or stamping, or may be made of plastic integrally by means of injection molding, or may be made of plastic as well as other materials (such as metal) integrally by means of insert molding. In some embodiments, the casing 10 may also be integrally formed by using single separated components.

Based on the above, in some embodiments, a structure of the casing cover 11 is substantially the same as a structure of the shielding housing 14. Thus, the casing cover 11 is mainly exemplified for description below. The casing cover 11 of the casing 10 includes a cover plate 111, a first side plate 112, a second side plate 113, and a third side plate 114. The first side plate 112, the second side plate 113, and the third side plate 114 of the casing cover 11 respectively extend from three adjacent side edges of the cover plate 111. The second side plate 113 is connected between the first side plate 112 and the third side plate 114. The first side plate 112 is disposed opposite to the third side plate 114. The base casing 12 of the casing 10 includes a base 121 and a fourth side plate 122. The fourth side plate 122 of the base casing 12 extends from a side edge on one side of the base 121. The fourth side plate 122 is connected between the first side plate 112 and the third side plate 114. The fourth side plate 122 is disposed opposite to the second side plate 113.

Based on the above, the casing 10 may be provided with at least one buckle hole 13. The at least one buckle hole 13 penetrates the cover plate 111 and the shielding housing 14, for at least one buckle member 23 to be disposed in the at least one buckle hole 13. The casing 10 may be provided with at least one penetrating hole 15. The at least one penetrating hole 15 penetrates the cover plate 111 and the shielding housing 14, for at least one pusher 40 to be disposed in the at least one penetrating hole 15.

In some embodiments, as shown in FIG. 2, the casing 10 may include four buckle holes 13 and two penetrating holes 15. However, the present disclosure is not limited thereto. The buckle holes 13 of the casing 10 each penetrate the cover plate 111 and the shielding housing 14, and the penetrating holes 15 each penetrate the cover plate 111 and the shielding housing 14. The four buckle holes 13 of the casing 10 include two side-by-side buckle holes 13 and other two side-by-side buckle holes 13. Two buckle holes 13 are close to the first side plate 112, and other two buckle holes 13 are close to the third side plate 114. A direction from the two buckle holes 13 to the other two buckle holes 13 is the same as a direction (which is opposite to an X-axis direction) from the first side plate 112 to the third side plate 114. A connection distance between the two buckle holes 13 equals to a connection distance between the other two buckle holes 13. One penetrating hole 15 of the casing 10 is close to the first side plate 112 and the fourth side plate 122. An other penetrating hole 15 of the casing 10 is close to the third side plate 114.

In some embodiments, each buckle hole 13 includes a snapping surface 131 and an unsnapping surface 132 opposite to each other. More specifically, a direction from the snapping surface 131 of the buckle hole 13 close to the first side plate 112 to the unsnapping surface 132 is the same as a direction from the first side plate 112 to the third side plate 114. A direction from the snapping surface 131 of the buckle hole 13 close to the third side plate 114 to the unsnapping surface 132 is opposite to the direction from the first side plate 112 to the third side plate 114.

In some embodiments, the accommodating hole H1 of the casing 10 is located on the first side plate 112, is close to the second side plate 113, and penetrates the shielding housing 14. In some embodiments, the accommodating hole H1 may also be located on the cover plate 111, the second side plate 113, the third side plate 114, or the fourth side plate 122. The present disclosure is not limited thereto.

In some embodiments, the plurality of the openings H2 of the casing 10 are located on the second side plate 113 and penetrate the shielding housing 14. The plurality of the openings H2 are used for the above plurality of electrical interfaces C to be disposed therein. In some embodiments, the openings H2 may also be located on the cover plate 111, the first side plate 112, the third side plate 114, or the fourth side plate 122. The present disclosure is not limited thereto.

Figure 4:
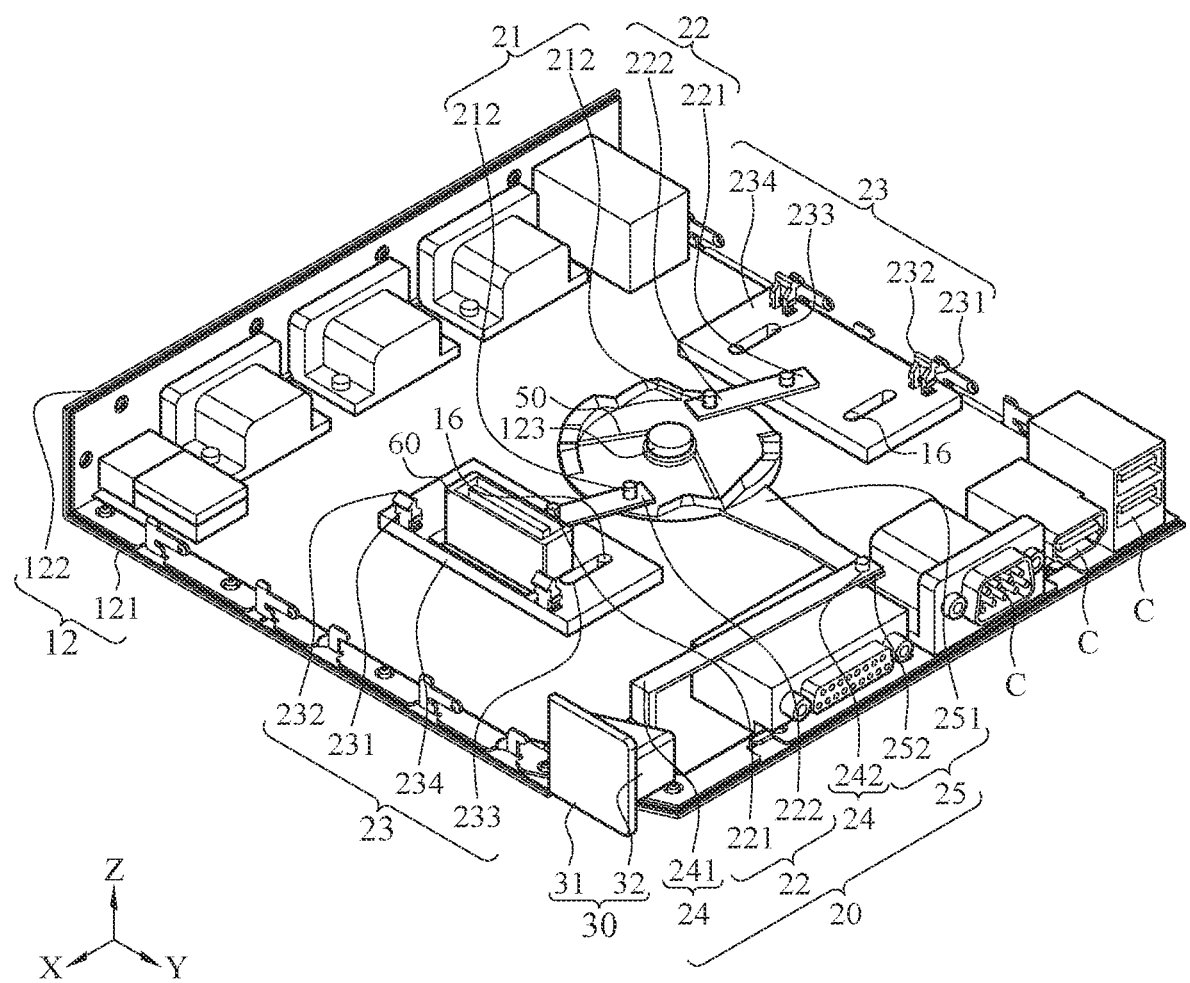
FIG. 4 illustrates a partial three-dimensional schematic diagram of the expansion equipment according to some embodiments, in which a casing cover and a shielding housing of a casing are removed, and partial first pivot members and partial first sliding rail portions are retained.

FIG. 4 illustrates a partial three-dimensional schematic diagram of the expansion equipment 100 (shown in FIG. 2) according to some embodiments, in which the casing cover 11 and the shielding housing 14 of the casing 10 are removed, and part of first pivot members 123 (details of the first pivot member 123 are described later) and part of the first sliding rail portions 16 are retained. In some embodiments, at least one first sliding rail portion 16 is disposed on the casing 10. As shown in FIG. 3 and FIG. 4, in some embodiments, the casing 10 may include two first sliding rail portions 16. However, the present disclosure is not limited thereto. The two first sliding rail portions 16 are disposed on the cover plate 111 opposite to each other. As shown in FIG. 3 and FIG. 4, one first sliding rail portion 16 is close to the first side plate 112, and another first sliding rail portion 16 is close to the third side plate 114.

As shown in FIG. 2 to FIG. 4, in some embodiments, the first pivot member 123 is disposed on the cover plate 111 of the casing 10. An axial direction of the first pivot member 123 is a direction from the cover plate 111 to the base 121 (which is opposite to the Z-axis direction herein). The first pivot member 123 may be located between the plurality of first sliding rail portions 16. In other words, the first sliding rail portions 16 are respectively located on two opposite sides of the first pivot member 123. In some embodiments, the first pivot member 123 may also be fixed to the base 121. Alternatively, the first pivot member 123 may be fixed between the base 121 and the cover plate 111.

In some embodiments, the transmission component 20 of the assembly module 1 is disposed in the casing 10. The transmission component 20 includes a transmission rod 24. The transmission rod 24 is connected between the operating member 30 and the rotary member 21. The operating member 30 drives the transmission rod 24, so that the transmission rod 24 can drive the rotary member 21 to rotate. In this way, the rotary member 21 drives the buckle member 23 to move between a first position and a second position by using the connecting member 22 (position statuses of the first position and the second position are described later). The expression "connection" includes direct connection and indirect connection. A connection relationship between separated components of the transmission component 20 is described in detail below.

In some embodiments, the rotary member 21 may be made of plastic cement or metal. The rotary member 21 may be a rotary disc. The rotary member 21 includes a first connecting part 211 and a second connecting part 212. The first connecting part 211 is located at a center of the rotary member 21, and the second connecting part 212 is close to an outer edge of the rotary member 21.

In some embodiments, the first connecting part 211 of the rotary member 21 is a hole, and the first pivot member 123 of the casing 10 is a pivotally connected shaft. The first connecting part 211 of the rotary member 21 is pivotally disposed on the first pivot member 123 of the casing 10. Thus, the rotary member 21 can be rotated relative to the casing 10 in the axial direction of the first pivot member 123 (that is, in a direction opposite to the Z-axis direction herein). In some embodiments, the first connecting part 211 may also be a connected shaft, and the first pivot member 123 may be a hole. The present disclosure is not limited thereto.

In some embodiments, the assembly module 1 further includes a torsion spring 50. A position on the torsion spring 50 is fixedly connected to the first pivot member 123, and other two ends of the torsion spring 50 are fixedly connected to the outer edge of the rotary member 21.

FIG. 5 illustrates a partial schematic cross-sectional view of the assembly module 1 (shown in FIG. 1) according to some embodiments, in which the buckle member 23 is not in operation. As shown in FIG. 4 and FIG. 5, each buckle member 23 of the transmission component 20 may include a buckle 231, a second sliding rail portion 233, and a pedestal 234. A tail end of the buckle 231 of the buckle member 23 has the buckle part 232. The buckle part 232 is formed by extending from the tail end of the buckle 231 to the snapping surface 131 of the buckle hole 13. The buckle 231 is inserted through the buckle hole 13. The buckle part 232 on the tail end of the buckle 231 extends out of the buckle hole 13 to be exposed from the buckle hole 13. As shown in FIG. 5, a gap is maintained between the buckle part 232 and the cover plate 111 of the casing 10, to accommodate and buckle a housing of the electronic device. In some embodiments, the buckle member 23 may include two buckles 231. The two buckles 231 are disposed on the pedestal 234 side by side, but the present disclosure is not limited thereto.

Figure 6:
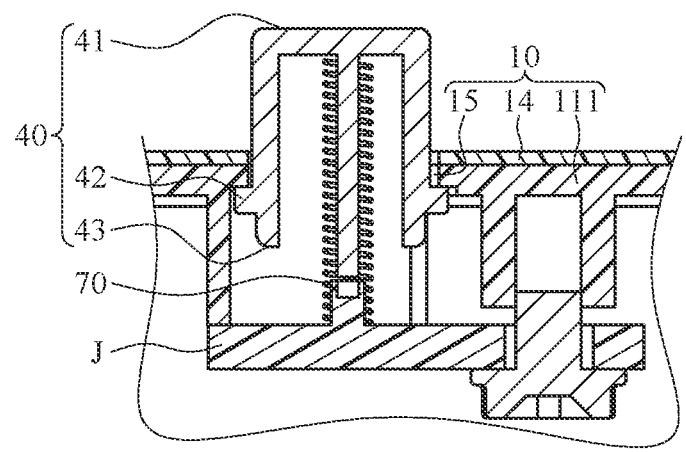
FIG. 6 illustrates another partial cross-sectional view of the assembly module according to some embodiments.
Figure 7:
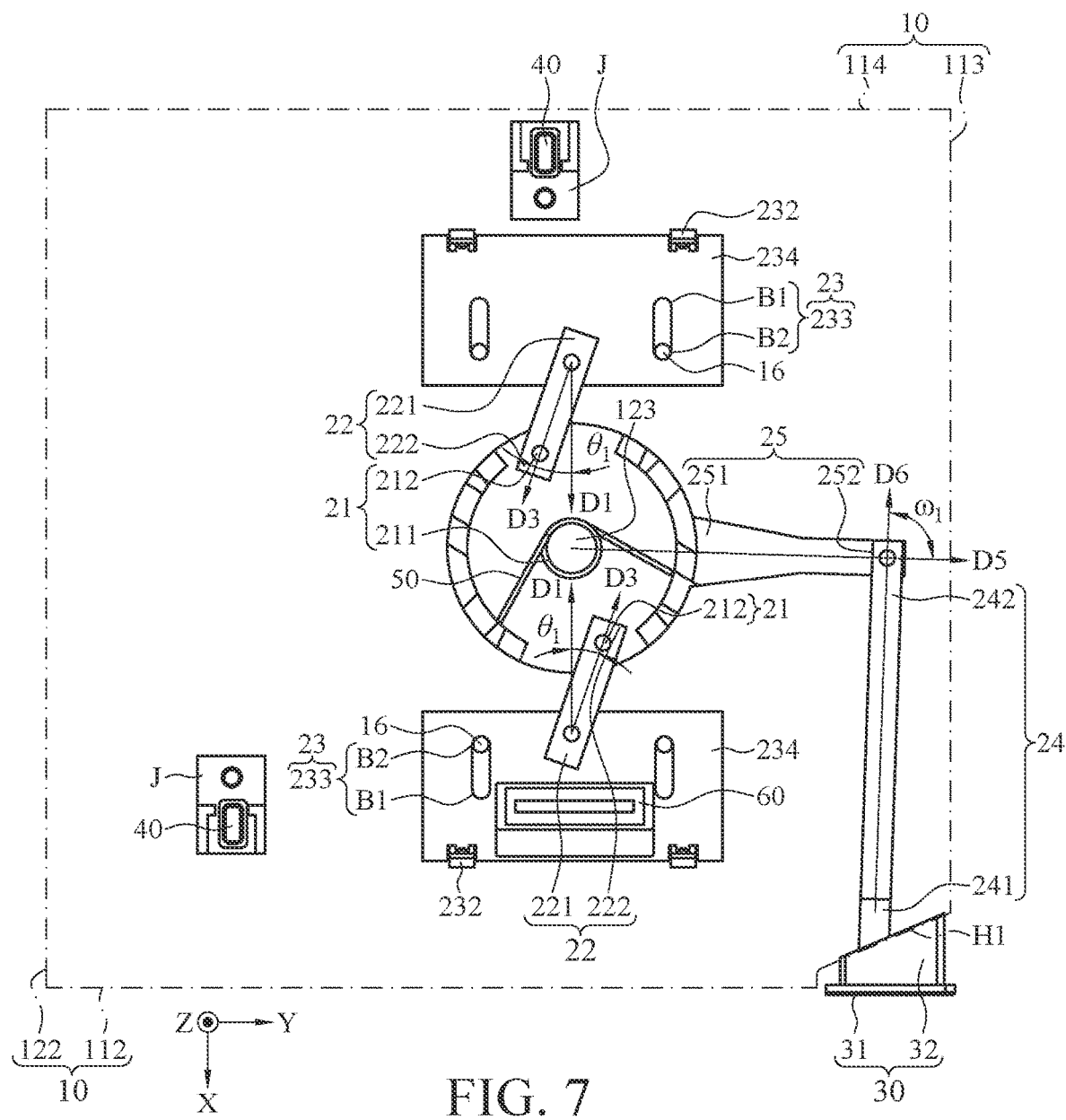
FIG. 7 illustrates a schematic top view of the assembly module according to some embodiments before operation.

FIG. 6 illustrates another partial schematic cross-sectional view of the assembly module 1 (shown in FIG. 1) according to some embodiments. FIG. 7 illustrates a schematic top view of the assembly module 1 (shown in FIG. 1) according to some embodiments before operation. For ease of illustration, boundaries of the casing 10 in FIG. 7 are illustrated by using dashed lines. Based on the above, as shown in FIG. 7, the buckle member 23 includes a second sliding rail portion 233. The second sliding rail portion 233 is disposed on the pedestal 234, and is adjacent to the buckle 231 (referring to FIG. 4). As shown in FIG. 7, the second sliding rail portion 233 has a first restrain portion B1 and a second restrain portion B2 opposite to each other and a sliding rail direction D1. The sliding rail direction D1 is a direction from the buckle member 23 to the rotary member 21. In some embodiments, the first sliding rail portion 16 may be a protruding post. The first sliding rail portion 16 may be disposed on the second sliding rail portion 233, so that the buckle member 23 is movably disposed on the casing 10 in the sliding rail direction D1. The first sliding rail portion 16 is limited between the first restrain portion B1 and the second restrain portion B2.

In some embodiments, the second sliding rail portion 233 of the buckle member 23 include two side-by-side linear penetrating holes respectively close to the second side plate 113 and the fourth side plate 122. The first sliding rail portion 16 may include two side-by-side protruding posts respectively close to the second side plate 113 and the fourth side plate 122. The second sliding rail portion 233 is disposed corresponding to the first sliding rail portion 16. In some embodiments, alternatively, the second sliding rail portion 233 may be a protruding post, and the first sliding rail portion 16 may be a penetrating hole or a groove. The present disclosure is not limited thereto.

In some embodiments, the transmission component 20 may include at least one buckle member 23 and at least one connecting member 22. As shown in FIG. 2, the transmission component 20 includes two buckle members 23 and two connecting members 22 (quantities of the buckle members 23 and the connecting members 22 are both two, but the present disclosure is not limited thereto) disposed thereon. The connecting members 22 are symmetrically disposed on two sides of the rotary member 21. One buckle member 23 is disposed closer the first side plate 112 than an other buckle member 23. Each buckle member 23 has a second sliding rail portion 233 disposed thereon, the second sliding rail portion 233 are respectively mated with the first sliding rail portions 16, so that the buckle members 23 are slidably disposed on the casing 10.

Referring to FIG. 2 to FIG. 7, the connecting member 22 of the transmission component 20 may be a link. The connecting member 22 may include a first link end 221 and a second link end 222 opposite to each other and a connecting direction D3. The first link end 221 of the connecting member 22 may be pivotally connected to the pedestal 234 of the buckle member 23, and the second link end 222 may be pivotally connected to the second connecting part 212 of the rotary member 21. The connecting direction D3 of the connecting member 22 is a direction from the first link end 221 to the second link end 222. A first angle $\theta_1$ is formed between the connecting direction D3 and the sliding rail direction D1. The connecting direction D3 needs to be rotated by the first angle $\theta_1$ in a direction opposite to the axial direction of the first pivot member 123 by using the second connecting part 212 as an axis to coincide with the sliding rail direction D1. For example, the first angle $\theta_1$ is 15 degrees, 30 degrees, or 45 degrees.

In some embodiments, a moment arm rod 25 may include a first moment arm rod end 251 and a second moment arm rod end 252 opposite to each other and a moment arm direction D5. The first moment arm rod end 251 may be fixedly connected to a side edge of the rotary member 21. The moment arm direction D5 is a direction from the first moment arm rod end 251 to the second moment arm rod end 252.

In some embodiments, the transmission rod 24 may include a first end 241 and a second end 242 opposite to each other and a push direction D6. The second end 242 of the 24 may be pivotally connected to the first moment arm rod end 251 of the moment arm rod 25. The push direction D6 is a direction from the first end 241 to the second end 242. A second angle $\omega_1$ is formed between the push direction D6 and the moment arm direction D5. The transmission rod 24 is indirectly connected to the rotary member 21 by using the moment arm rod 25. In some embodiments, depending on use requirements, the transmission rod 24 of the transmission component 20 may also be directly connected to the rotary member 21 without using the moment arm rod 25.

In some embodiments, the operating member 30 of the assembly module 1 is located outside of the casing 10. The operating member 30 is correspondingly disposed in the accommodating hole H1 of the casing 10. In some embodiments, the operating member 30 includes an operating portion 31 and a connection portion 32. The connection portion 32 extends from the operating portion 31. An area of the operating portion 31 is greater than an area of the accommodating hole H1 of the casing 10. The area of the accommodating hole H1 is greater than an area of the connection portion 32. Therefore, the connection portion 32 may be inserted through the accommodating hole H1, so that the operating portion 31 is located outside the casing 10. The connection portion 32 of the operating member 30 is fixedly connected to the first end 241 of the transmission rod 24. In addition, based on the above connection relationship among the transmission rod 24, the rotary member 21, the connecting member 22, and the buckle member 23, the operating member 30 can be driven by the transmission component 20 to operate.

In some embodiments, the assembly module 1 further includes pushers 40. Referring to FIG. 2 and FIG. 6, each pusher 40 includes a limiting block 42 and an pushing surface 41 and a base surface 43 opposite to each other. The pushing surface 41 is inserted through the penetrating hole 15. The limiting block 42 is located between the pushing surface 41 and the base surface 43. An area of the limiting blocks 42 is greater than an area of each cross section located between the pushing surface 41 and the limiting block 42 in the pusher 40. In some embodiments, a cantilever support J is fixedly disposed at a position on the cover plate 111 that is close to each penetrating hole 15. An elastic member 70 is disposed on each cantilever support J. The base surface 43 is disposed on one end of the elastic member 70. The elastic member 70 pushes against the pusher 40, and provides a deformation energy for the pusher 40, so that the pusher 40 can protrude out of the penetrating hole 15.

A connection relationship between the operating member 30 and the transmission component 20 is described below.

Figure 8:
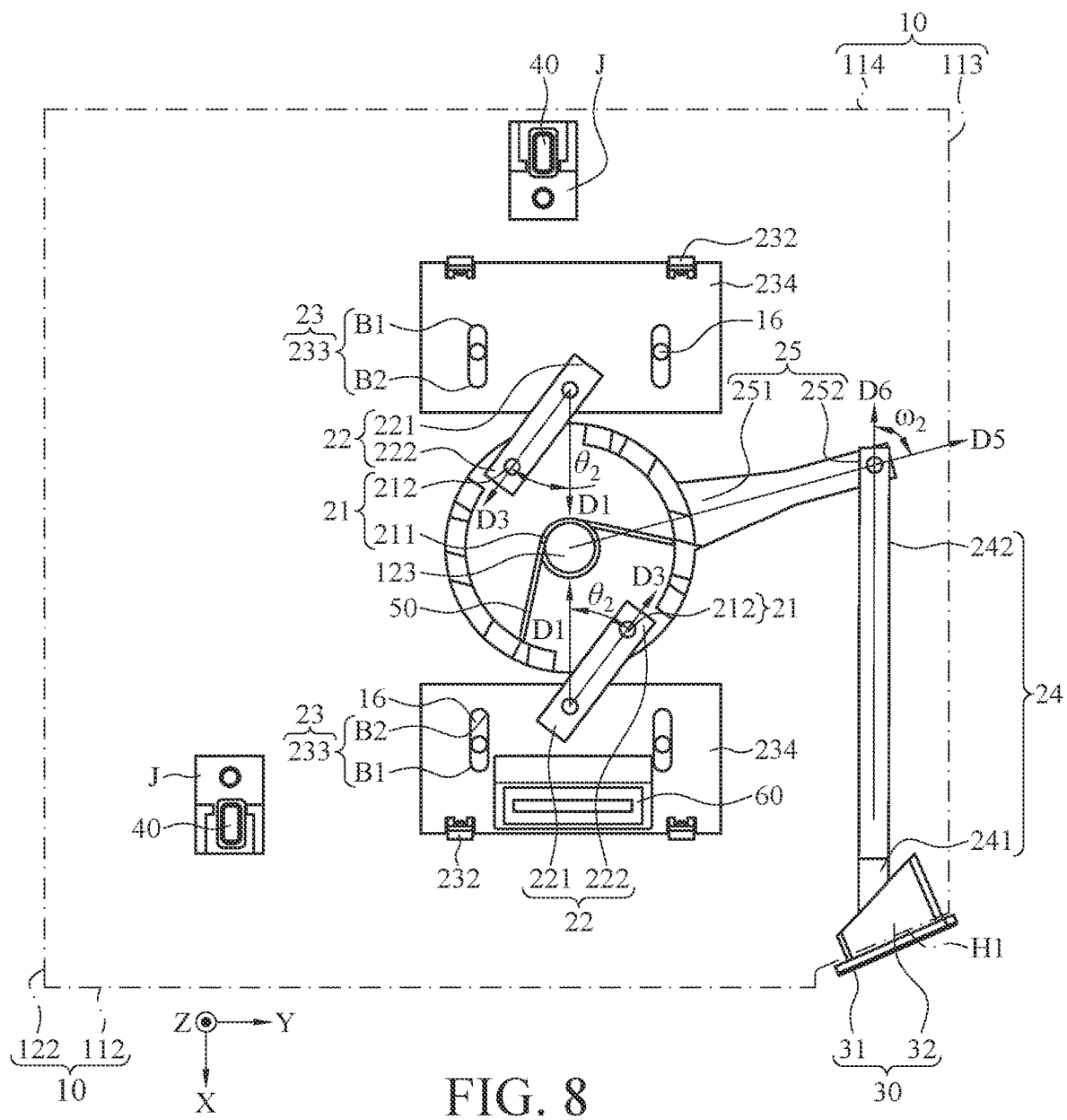
FIG. 8 illustrates a schematic top view of the assembly module according to some embodiments during operation.

FIG. 8 illustrates a schematic top view of the assembly module 1 (shown in FIG. 1) according to some embodiments during operation. FIG. 9 illustrates a partial schematic cross-sectional view of the assembly module 1 (shown in FIG. 1) according to some embodiments, in which the buckle member 23 is in operation. Referring to FIG. 2 to FIG. 9 together, when the electronic device is combined with the expansion equipment 100, the operating member 30 is at an initial position, and the operating portion 31 of the operating member 30 is at a position farthest from the accommodating hole H1. Referring also to FIG. 2 and FIG. 5, the buckle member 23 is a first position. In this case, the buckle part 232 of the buckle member 23 approaches the snapping surface 131 of the buckle hole 13 (as shown in FIG. 5, the buckle part 232 is snapped into an upper surface of the shielding housing 14). Part of a projection of the buckle part 232 of the buckle member 23 toward the buckle hole 13 (in a direction opposite to the z-axis direction) falls on the shielding housing 14. In this way, the housing of the electronic device can be buckled between the buckle part 232 and the casing 10 by using the assembly module 1, thereby buckling the expansion equipment 100 to the electronic device.

Moreover, the second restrain portion B2 of the second sliding rail portion 233 leans against the first sliding rail portion 16. In some embodiments, when each buckle member 23 is at the first position, a gap may be retained between the second restrain portion B2 of the second sliding rail portion 233 and the first sliding rail portion 16, to provide a sufficient space for the buckle part 232 of each buckle member 23 to move to push against the snapping surface 131 of each buckle hole 13. In some embodiments, by means of the elastic member 70 connected between each pusher 40 and each cantilever support J. When the buckle member 23 is at the first position and the expansion equipment 100 is buckled to the electronic device, the pusher 40 can be pushed toward the cantilever support J by the electronic device, to squeeze each elastic member 70, so as to accumulate a deformation energy for the elastic member 70.

When a user is to separate the expansion equipment 100 from the electronic device, an operating force is applied to the operating portion 31, so that the operating member 30 is moved from the initial position to the accommodating hole H1. Therefore, the transmission rod 24 connected to the operating member 30 is driven by the operating member 30 to move in the push direction D6, and generates a push force in the push direction D6. Since the rotary member 21 is connected to the transmission rod 24 by using the moment arm rod 25, the moment arm rod 25 converts the push force delivered by the transmission rod 24 to a tangential force of the rotary member 21, so that the rotary member 21 generates a torque and is rotated in the direction opposite to the axial direction of the first pivot member 123. In addition, since the moment arm rod 25 increases a distance between the first pivot member 123 of the rotary member 21 and a force application point, the torque generated by the rotary member 21 can be amplified.

In some embodiments, the second angle on between the push direction D6 of the transmission rod 24 and the moment arm direction D5 (which is the same as a y-axis direction herein) of the moment arm rod 25 is 90 degrees, and a connecting line in the moment arm direction D5 passes through the first connecting part 211 of the rotary member 21. Therefore, the moment arm rod 25 can completely convert the push force to the tangential force, thereby increasing the efficiency of the operating force applied to the operating member 30. In some embodiments, depending on requirements, the second angle formed between the push direction D6 of the transmission rod 24 and the moment arm direction D5 of the moment arm rod 25 may also be 60 degrees or 75 degrees.

Since the first link end 221 and the second link end 222 of the connecting member 22 are respectively connected to the buckle member 23 and the rotary member 21, during rotation of the rotary member 21 in the direction opposite to the axial direction of the first pivot member 123, the buckle member 23 is driven by the connecting member 22 to generate a pull force component toward the rotary member 21, so as to move away from the first position. In addition, since the movement direction of the buckle member 23 is limited by the first sliding rail portion 16 and the second sliding rail portion 233, the buckle member 23 is limited to move linearly relative to the casing 10 in the sliding rail direction D1 toward the rotary member 21. During the above linkage, as shown in FIG. 5 and FIG. 9, the buckle 231 of the buckle member 23 moves gradually away from the snapping surface 131, and the first restrain portion B1 of the second sliding rail portion 233 is moved toward the first sliding rail portion 16.

Based on the above, when the operating force is continuously applied to the operating member 30, and the operating portion 31 of the operating member 30 is at a position closest to the accommodating hole H1, the operating member 30 is at an operating position. At the operating position, a second angle $\omega_2$ between the push direction D6 and the moment arm direction D5 of the moment arm rod 25 is less than the second angle on (referring to FIG. 7) at the initial position. At the operating position, a first angle θ2 between the connecting direction D3 and the sliding rail direction D1 is greater than the first angle $θ_1$ (referring to FIG. 7) at the initial position. In this case, the buckle member 23 is moved away from the first position and toward the second position (for example, the buckle member 23 is moved from the first position in FIG. 5 to the second position in FIG. 9). When the buckle member 23 is at the second position, the second restrain portion B2 of the second sliding rail portion 233 is close to the first sliding rail portion 16, and the buckle part 232 of the buckle member 23 is away from the snapping surface 131 and the housing of the electronic device, so that the expansion equipment 100 is unbuckled from the electronic device. At the same time, the elastic member 70 gradually releases the deformation energy to push the pusher 40 toward the penetrating hole 15 and push the electronic device away from the expansion equipment 100. In addition, since the limiting block 42 is limited in the penetrating hole 15 of the casing 10, the pusher 40 is prevented from being disengaged from the casing 10 through the penetrating hole 15 during the above operation.

Based on the above, as shown in FIG. 7 and FIG. 8, when the operating force applied to the operating member 30 is released, the rotary member 21 is no longer subjected to the operating force, and therefore the torsion spring 50 releases the deformation energy accumulated in the above process, so that the rotary member 21 is rotated in the axial direction of the first pivot member 123. Therefore, the rotary member 21 drives the buckle member 23 to return from the second position to the first position (referring to FIG. 5 and FIG. 9), and drives the operating member 30 to return from the operating position to the initial position.

In some embodiments, as shown in FIG. 2, the assembly module 1 further includes an electrical connector 60. The electrical connector 60 is exposed from the casing 10, and may be directly electrically connected to the electronic device by means of the assembly module 1. In this way, the expansion equipment 100 can be electrically connected to the electronic device, so as to expand functions of the electronic device. In some embodiments, the electrical connector 60 may be disposed close to the buckle member 23, but the present disclosure is not limited thereto.

Figure 10:
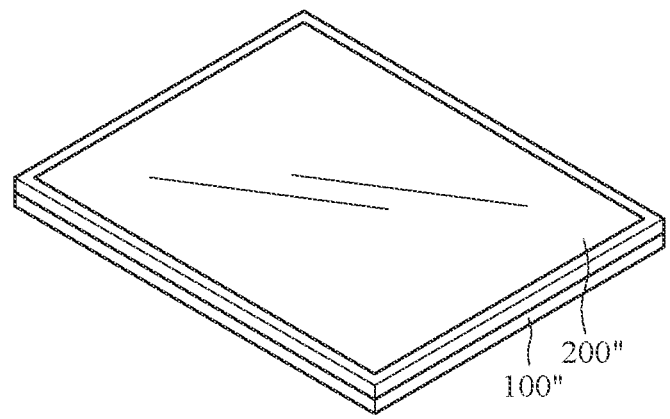
FIG. 10 illustrates a schematic assembled diagram of an expansion equipment and an electronic device according to some embodiments.
Figure 11:
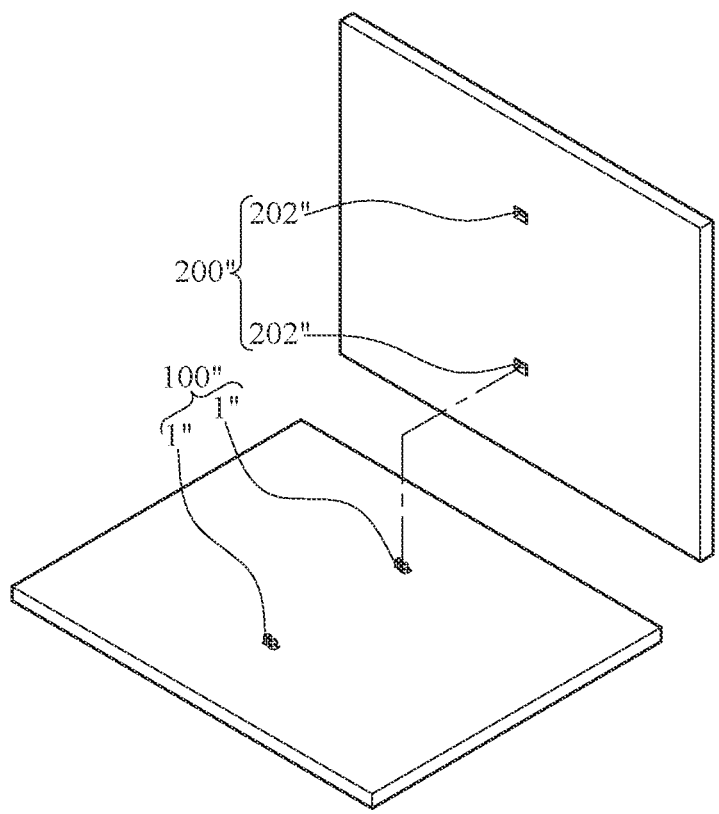
FIG. 11 illustrates a schematic exploded view of the expansion equipment and the electronic device according to some embodiments.

FIG. 10 illustrates a schematic assembled diagram of an expansion equipment 100" and an electronic device 200" according to some embodiments. FIG. 11 illustrates a schematic exploded view of the expansion equipment 100" and the electronic device 200" according to some embodiments. In some embodiments, the expansion equipment 100" and the electronic device 200" are two display panels. By means of an assembly module 1" on the expansion equipment 100" and an assembling hole 202" of the electronic device 200", the expansion equipment 100" can be assembled onto or disassembled from the electronic device 200".

Figure 12:
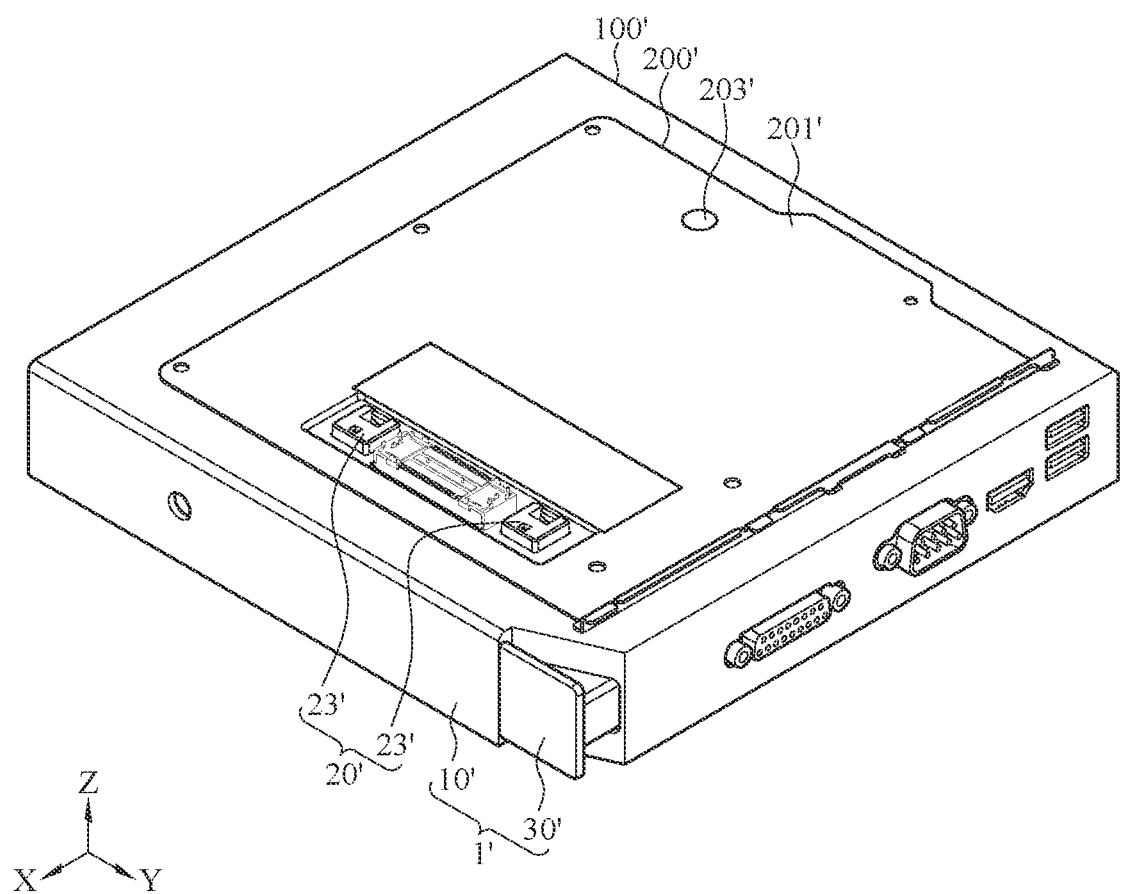
FIG. 12 illustrates a schematic assembled diagram of an expansion equipment and an electronic device according to some embodiments.
Figure 13:
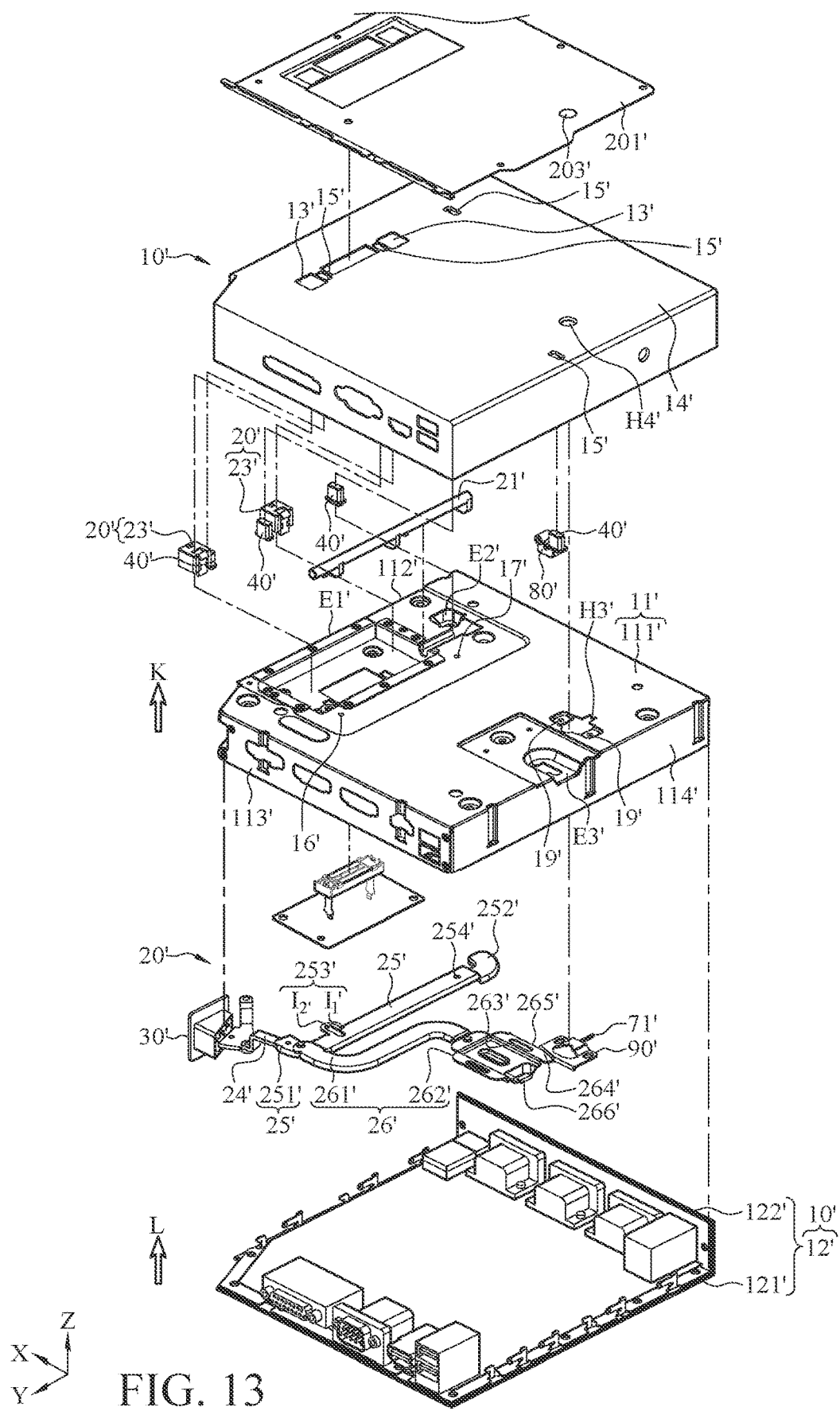
FIG. 13 illustrates a schematic exploded view of the expansion equipment and the electronic device according to some embodiments.

FIG. 12 illustrates a schematic assembled diagram of an expansion equipment 100' and an electronic device 200' according to some embodiments. FIG. 13 illustrates a schematic exploded view of the expansion equipment 100' and the electronic device 200' (shown in FIG. 12) according to some embodiments. As shown in FIG. 10, in some embodiments, the expansion equipment 100' may be buckled with a housing 201' of the electronic device 200' by using an assembly module 1', so that the expansion equipment 100' is fixed to the electronic device 200'. A detailed buckling manner of the assembly module 1' and the housing 201' is described later. As shown in FIG. 13, in some embodiments, the assembly module 1' includes a casing 10', a transmission component 20', and an operating member 30'.

As shown in FIG. 13, in some embodiments, the casing 10' of the assembly module 1' includes a casing cover 11', a base casing 12', and a shielding housing 14'. The casing cover 11' is located between the base casing 12' and the shielding housing 14'. The casing cover 11' is disposed corresponding to the base casing 12'. The shielding housing 14' covers the casing cover 11'.

As shown in FIG. 13, in some embodiments, a first groove E1', a second groove E2', and a third groove E3' are provided on a cover plate 111' of the casing cover 11'. The first groove E1', the second groove E2', and the third groove E3' are all formed by depressing the cover plate 111' toward the base casing 12', and form an accommodating space with the shielding housing 14'. The first groove E1' is close to a first side plate 112' and a second side plate 113'. The second groove E2' is close to the first side plate 112' and a fourth side plate 122'. The third groove E3' is close to the third side plate 114'. The third groove E3' is located in the middle between the second side plate 113' and the fourth side plate 122'. However, positions of the grooves are not limited thereto.

Figure 14:
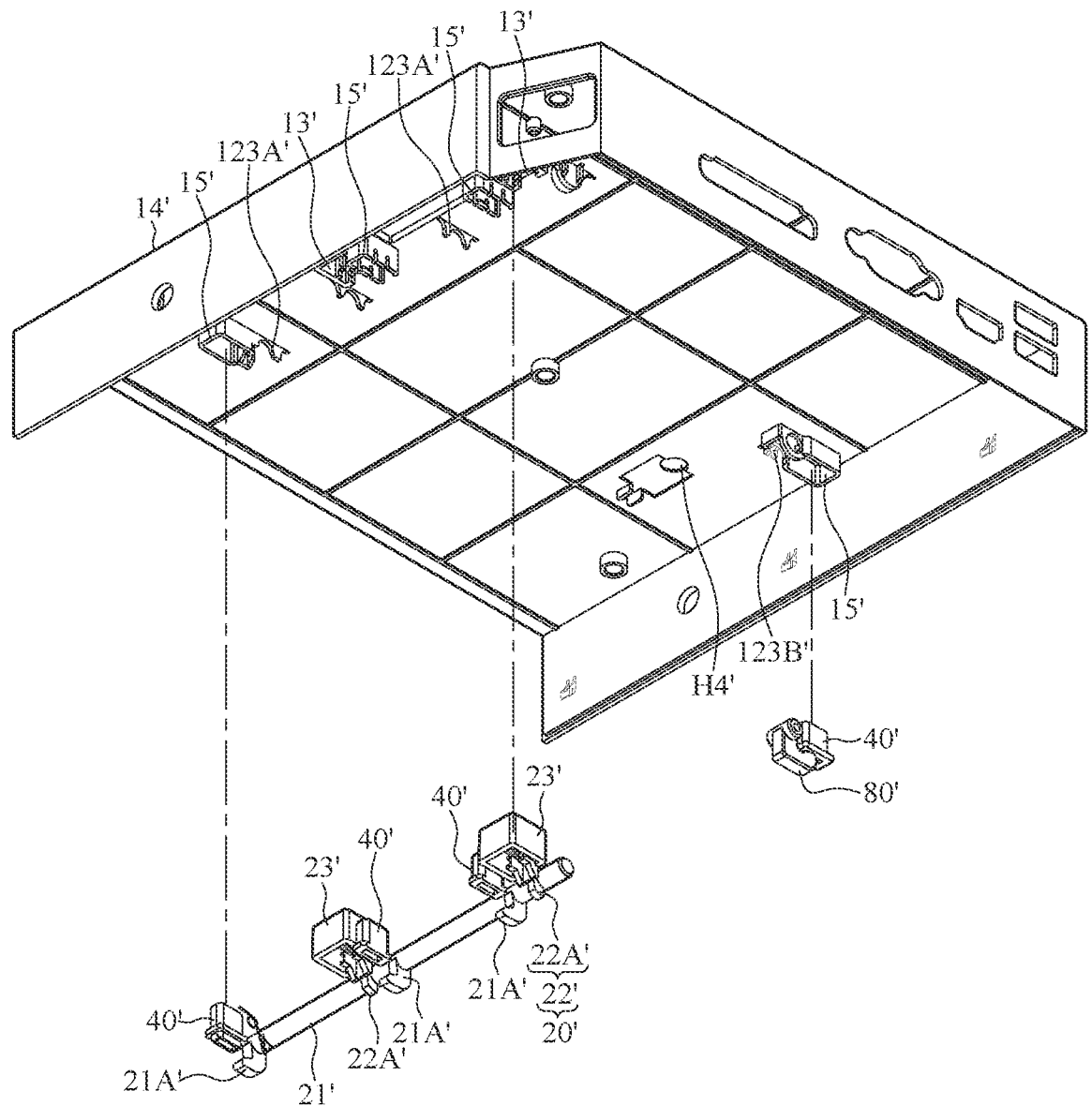
FIG. 14 illustrates a schematic exploded view of partial components of an expansion equipment and an electronic device from a perspective of an indicator line K in FIG. 13.
Figure 15:
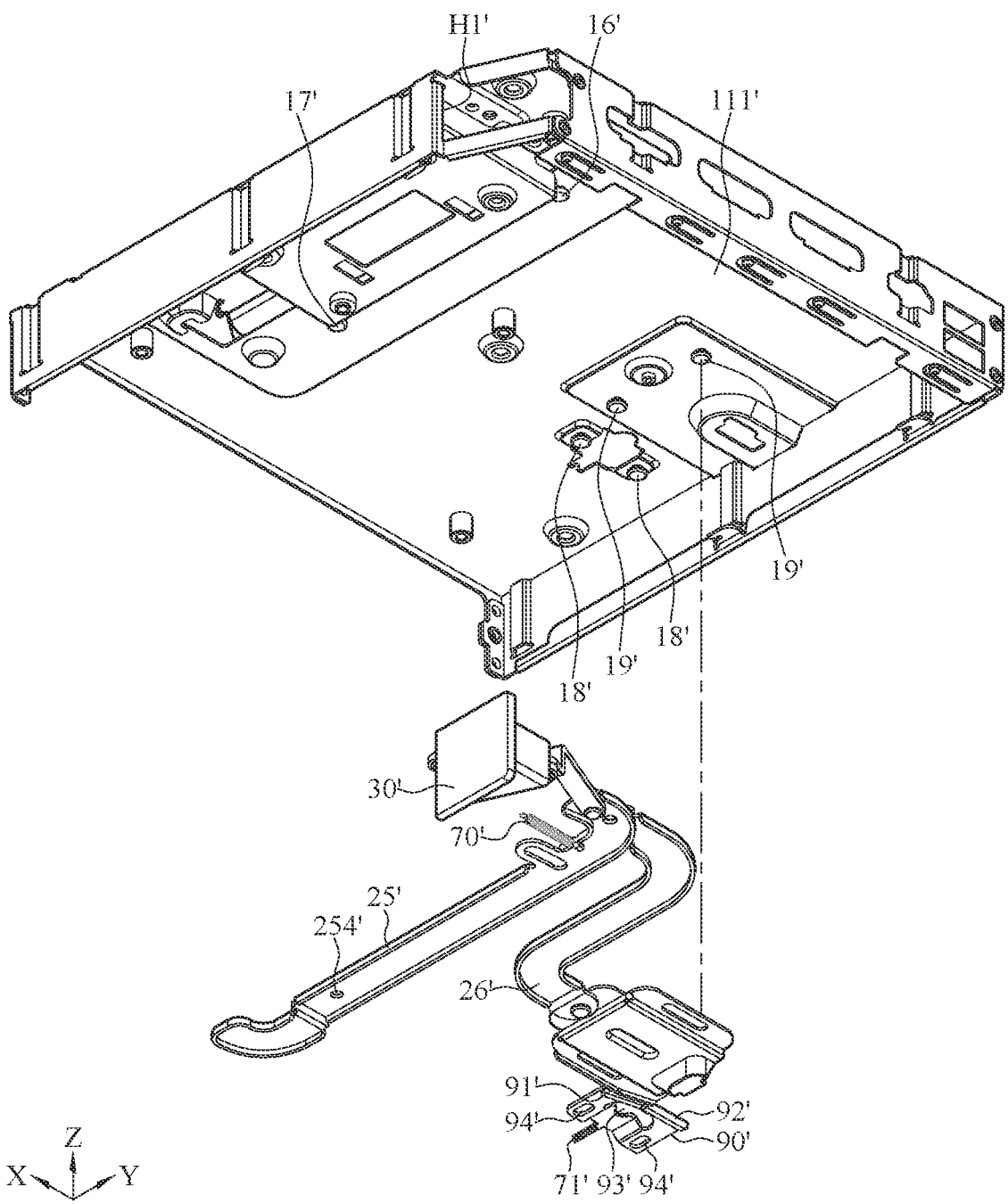
FIG. 15 illustrates a schematic exploded view of partial components of the expansion equipment and the electronic device from a perspective of an indicator line L in FIG. 13.

FIG. 14 illustrates a schematic exploded diagram of partial components of the expansion equipment 100' and the electronic device 200' (shown in FIG. 12) from a perspective of an indicator line K in FIG. 13. FIG. 15 illustrates a schematic exploded view of partial components of the expansion equipment 100' and the electronic device 200' (shown in FIG. 12) from a perspective of an indicator line L in FIG. 13. Based on the above, as shown in FIG. 13 and FIG. 15, a first guiding rail portion 16', a first connected portion 17', a third guiding rail portion 18', a fifth guiding rail portion 19', and a limiting hole H3' are disposed on the cover plate 111' of the casing cover 11'. The first guiding rail portion 16' is close to the first groove E1' and the second side plate 113'. The first connected portion 17' is close to the second groove E2' and the fourth side plate 122'. A direction from the first guiding rail portion 16' to the first connected portion 17' is the same as a direction (opposite to a Y-axis direction herein) from the second side plate 113' to the fourth side plate 122'. The third guiding rail portion 18' is close to the third groove E3'. The third guiding rail portion 18' is farther from the third side plate 114' than from the third groove E3'. The fifth guiding rail portion 19' is close to the third guiding rail portion 18'. The fifth guiding rail portion 19' is closer to the third side plate 114' and the fourth side plate 122' than the third guiding rail portions 18'. The limiting hole H3' is close to the third guiding rail portion 18'.

As shown in FIG. 13 and FIG. 14, a buckle hole 13', a penetrating hole 15', and a through hole H4' are provided on the shielding housing 14'. In some embodiments, two buckle holes 13' and four penetrating holes 15' are provided on the shielding housing 14'. Two penetrating holes 15' are correspondingly provided in the first groove E1'. The two penetrating holes 15' are arranged between the two buckle holes 13' in sequence in a direction from the first side plate 112' to the third side plate 114'. Directions of connecting lines between the two buckle holes 13' and the two penetrating holes 15' equal to a direction (that is, the direction opposite to the Y-axis direction herein) of a connecting line between the first guiding rail portion 16' and the first connected portion 17'. One penetrating hole 15' corresponds to the second groove E2', to form an accommodating space between the penetrating hole 15' and a bottom of the second groove E2'. An other penetrating hole 15' corresponds to the third groove E3', to form an accommodating space between the penetrating hole 15' and a bottom of the third groove E3'. The through hole H4' corresponds to the limiting hole H3'. Configurations of a snapping surface 131' and an unsnapping surface 132' of each buckle hole 13' are the same as the configurations of the snapping surface 131 and the unsnapping surface 132 of the above buckle hole 13. Details are not described herein again.

As shown in FIG. 13 to FIG. 15, in some embodiments, a second pivot member 123A' and a third pivot member 123B' are disposed on the shielding housing 14'. The second pivot member 123A' is disposed on a side of the shielding housing 14' that faces the casing cover 11'. The second pivot member 123A' is located between the connecting line between the buckle hole 13' and the penetrating hole 15' and the connecting line between the first guiding rail portion 16' and the first connected portion 17'. An axial direction of the second pivot member 123A' equals to a direction (which is opposite to the Y-axis direction herein) from the first guiding rail portion 16' to the first connected portion 17'. The third pivot member 123B' is disposed on the shielding housing 14'. An axial direction of the third pivot member 123B' equals to a direction (which is the same as the Y-axis direction herein) from the fourth side plate 122' to the second side plate 113'. The third pivot member 123B' is close to the penetrating hole 15'.

As shown in FIG. 12 to FIG. 14, in some embodiments, the transmission component 20' includes a rotary member 21', a connecting member 22', a buckle member 23', a transmission rod 24', a first force transfer rod 25', and a second force transfer rod 26'. The connecting member 22' of the transmission component 20' is connected between the rotary member 21' and the buckle member 23'. The transmission rod 24' is connected to the first force transfer rod 25'. The first force transfer rod 25' is connected to the second force transfer rod 26'. The transmission rod 24' can drive the first force transfer rod 25' to push against the rotary member 21', so that the rotary member 21' drives the buckle member 23' to move between a first position and a second position by using the connecting member 22'. The first force transfer rod 25' can drive the second force transfer rod 26' to move. The expression "connection" includes direct connection and indirect connection. A connection relationship between separated components of the transmission component 20' is described in detail below. When the buckle member 23' is at the first position and the second position, a relative relationship between the buckle member 23' and the buckle holes 13' is same as the relative relationship between the buckle member 23 and the buckle hole 13 when the buckle member is at the first position and the second position. At the first position, the buckle member 23' can cause the expansion equipment to be buckled with the electronic device, as same as the aforementioned buckle member 23. At the second position, the buckle member 23' can cause the expansion equipment to be unbuckled from the electronic device aforementioned buckle member 23. Therefore, details are not described herein again.

In some embodiments, the rotary member 21' of the transmission component 20' may be a rotary shaft. One end of the rotary member 21' is close to the second side plate 113', and an other end of the rotary member 21' is close to the fourth side plate 122'. As shown in FIG. 12, the second pivot member 123A' includes a plurality of separators. A pivotally connected hole penetrates each separator. The rotary member 21' is coaxial with the second pivot member 123A'. The rotary member 21' is pivotally disposed on the second pivot member 123A' of the shielding housing 14'. The rotary member 21' may be rotated in an axial direction (which is opposite to the Y-axis direction herein) of the second pivot member 123A'.

Based on the above, as shown in FIG. 14, the rotary member 21' include an pushing portion 21A'. The pushing portion 21A' extends from a side edge of the rotary member 21'. The pushing portion 21A' is close to the penetrating hole 15'. In some embodiments, the rotary member 21' may include three pushing portions 21A'. The pushing portions 21A' are arranged side by side in an axial direction of the rotary member 21'. The connecting member 22' of the transmission component 20' is formed by extending outwardly from the side edge of the rotary member 21' (the rotary shaft). The side edge of the rotary member 21' may be a radial surface of the rotary shaft. In some embodiments, the connecting member 22' includes two protruding blocks 22A' disposed side by side. The protruding blocks 22A' are arranged side by side in the axial direction of the rotary member 21'. The connecting member 22' and the rotary member 21' may be integrally formed or spliced. The buckle member 23' of the transmission component 20' is inserted through the buckle hole 13', and is accommodated in the accommodating space formed by the bottom of the first groove E1' and the shielding housing 14'. Each buckle member 23' is close to each protruding block 22A' of the connecting members 22'.

Figure 16:
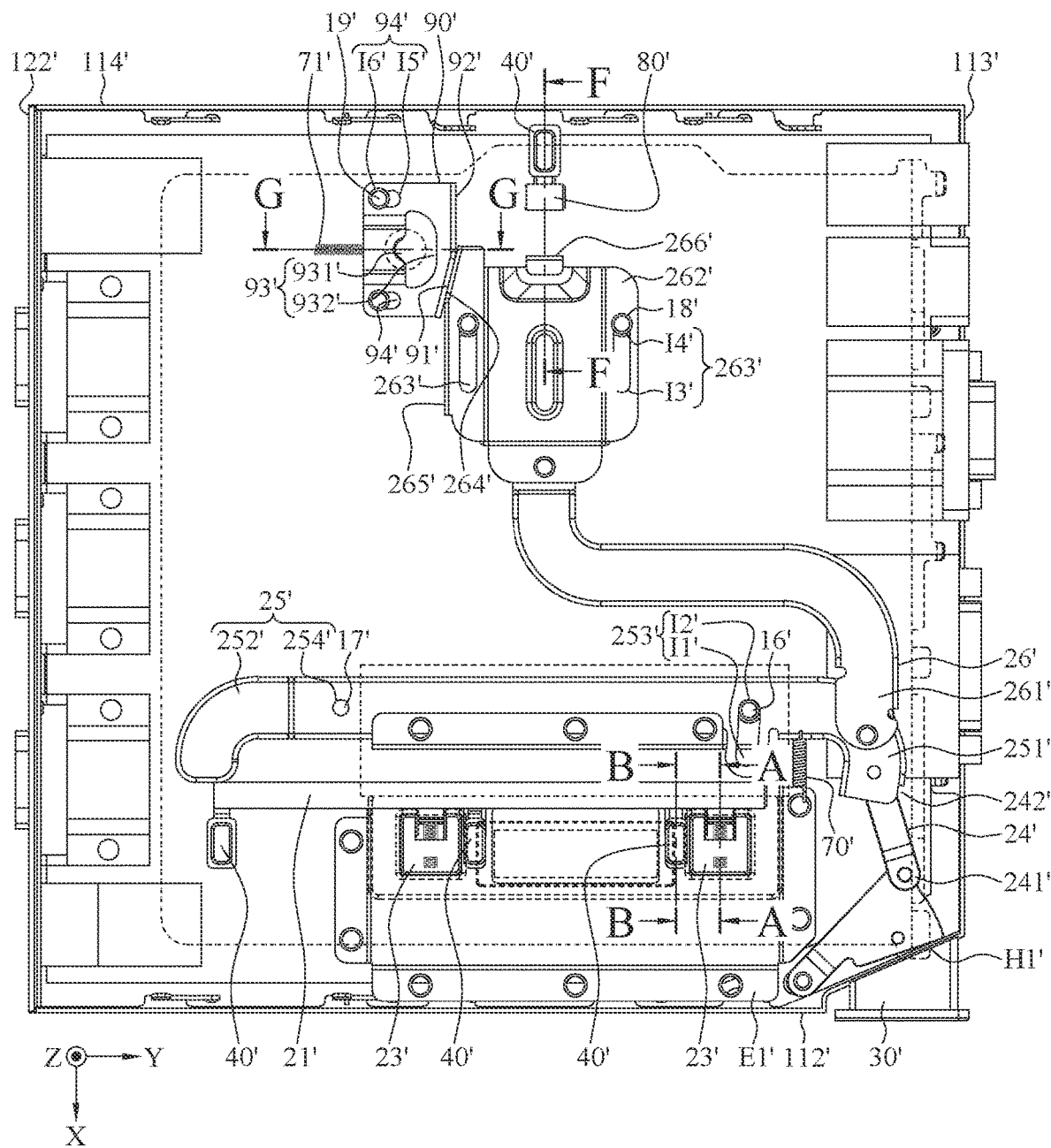
FIG. 16 illustrates a schematic top view of the expansion equipment and the electronic device according to some embodiments, in which a casing is in a transparent state.
Figure 17:
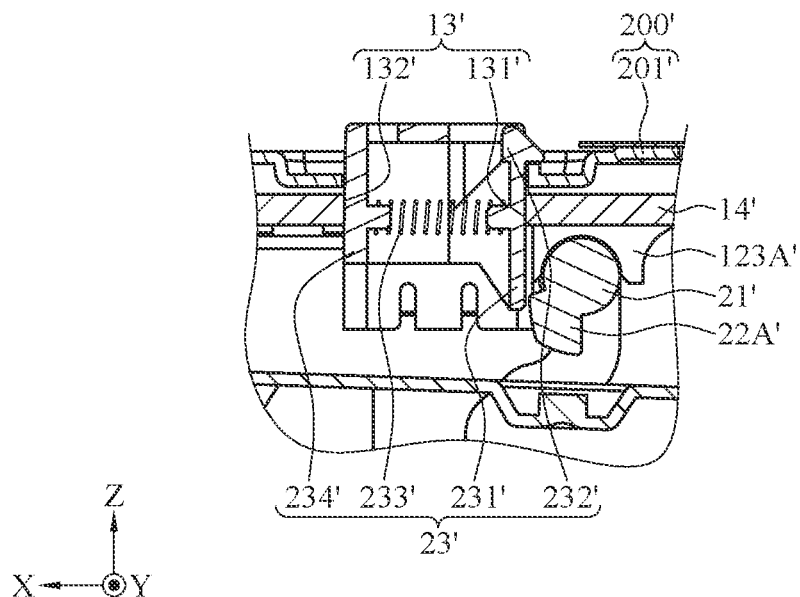
FIG. 17 illustrates a schematic partial cross-sectional view of the assembly module and the electronic device from a perspective of an indicator line A-A in FIG. 16, showing a status of the assembly module before operation.

Based on the above, FIG. 16 illustrates a schematic top view of the expansion equipment 100' and the electronic device 200' (shown in FIG. 12) according to some embodiments, in which the casing is in a transparent state, and the electronic device is marked by using dashed lines. FIG. 17 illustrates a schematic partial cross-sectional view of the assembly module 1' and the electronic device 200' (shown in FIG. 12) from a perspective of an indicator line A-A in FIG. 16, showing a status of the assembly module before operation. As shown in FIG. 17, the buckle member 23' includes a buckle 231', a buckle part 232', a restoration member 233', and a fixing base 234'. The buckle 231' and the fixing base 234' are respectively close to the snapping surface 131' and the unsnapping surface 132' of the buckle hole 13'. The restoration member 233' is connected between the buckle 231' and the fixing base 234'. The buckle 231' is inserted through the buckle hole 13' of the shielding housing 14'. The buckle part 232' extends from a tail end of the buckle 231' toward the snapping surface 131' of the buckle hole 13' to buckle the expansion equipment 100' with the electronic device 200'. When the buckle 231' is moved in an unbuckling direction, a gap is formed between the buckle 231' and the snapping surface 131'. In this way, the expansion equipment 100' can be unbuckled from the electronic device 200'. The unbuckling direction may be a direction away from the snapping surface 131' or a direction toward the unsnapping surface 132'. In some embodiments, the restoration member 233' is a spring disposed between the buckle 231' and the fixing base 234'.

As shown in FIG. 13 and FIG. 16, in some embodiments, the first force transfer rod 25' includes a first force transfer portion 251' and a second force transfer portion 252' respectively disposed on two ends of the first force transfer rod 25', and has a second guiding rail portion 253' and a second connected portion 254' disposed thereon. The first force transfer portion 251' is close to an end of the rotary member 21' that is close to the second side plate 113'. The second force transfer portion 252' is close to an end of the rotary member 21' that is close to the fourth side plate 122'. The first force transfer portion 251' of the first force transfer rod 25' is pivotally connected to a second end 242' of the transmission rod 24'. The second force transfer portion 252' is in contact with the rotary member 21'.

In some embodiments, the second guiding rail portion 253' of the first force transfer rod 25' is close to the first force transfer portion 251'. The second guiding rail portion 253' has a first limiting portion IF and a second limiting portion 12'. The second guiding rail portion 253' is disposed corresponding to the first guiding rail portion 16'. The first guiding rail portion 16' may be moved between the first limiting portion IF and the second limiting portion 12' of the second guiding rail portion 253'. In some embodiments, the first guiding rail portion 16' is a guide post. The first guiding rail portion 16' extends from the casing cover 11' toward the base casing 12'. The second guiding rail portion 253' may be an arcuate guiding groove.

In some embodiments, the second connected portion 254' of the first force transfer rod 25' is close to the second force transfer portion 252'. The second connected portion 254' of the first force transfer rod 25' is pivotally connected to the first connected portion 17'. In some embodiments, the first connected portion 17' is a pivotally connected shaft. The first connected portion 17' extends from the cover plate 111' toward the base casing 12' (an axial direction of the first connected portion 17' is opposite to the Z-axis direction herein). The second connected portion 254' is a pivotally connected hole. The second connected portion 254' is coaxial with the first connected portion 17'.

In some embodiments, a first elastic member 70' may be disposed on the assembly module 1'. The first elastic member 70' is disposed between the casing cover 11' and the first force transfer rod 25'. In some embodiments, the first elastic member 70' is a spring. One end of the first elastic member 70' is connected to a position on the first force transfer rod 25' that is close to the first force transfer portion 251', and an other end of the first elastic member 70' is connected to one side of the first groove E1'. The first elastic member 70' is configured to provide a deformation energy for the first force transfer rod 25'.

In some embodiments, a third force transfer portion 261' and a fourth force transfer portion 262' are disposed on the second force transfer rod 26'. The third force transfer portion 261' of the second force transfer rod 26' is connected to a position on the first force transfer rod 25' that is close to the first force transfer portion 251'. The fourth force transfer portion 262' is close to the third side plate 114'. A fourth guiding rail portion 263', a first guiding surface 264', a first contact surface 265', and a push surface 266' are disposed on the fourth force transfer portion 262'. The first guiding surface 264', the first contact surface 265', and the push surface 266' are disposed on a peripheral edge of the fourth force transfer portion 262'. The first guiding surface 264' is connected between the first contact surface 265' and the push surface 266'. The push surface 266' is disposed on a side of the fourth force transfer portion 262' that faces the third side plate 114'. The fourth guiding rail portion 263' is disposed corresponding to the third guiding rail portion 18'. The fourth guiding rail portion 263' has a third limiting portion 13' and a fourth limiting portion 14' opposite to each other. The fourth limiting portion 14' is closer to the push surface 266' than the third limiting portion 13'. The third guiding rail portion 18' may be limited to move between the third limiting portion 13' and the fourth limiting portion 14' of the fourth guiding rail portion 263'. In some embodiments, the third guiding rail portion 18' includes two side-by-side protruding posts. The fourth guiding rail portion 263' includes two side-by-side linear penetrating holes. In this way, the third guiding rail portion 18' is limited to move linearly between the third limiting portion 13' and the fourth limiting portion 14' of the fourth guiding rail portion 263'.

Referring to FIG. 13 to FIG. 16, in some embodiments, the transmission component 20' may further include a limiting member 90' and a second elastic member 71'. The limiting member 90' of the transmission component 20' includes a second guiding surface 91', a second contact surface 92', a limiting hole 93', and a sixth guiding rail portion 94'. The second guiding surface 91' and the second contact surface 92' are connected to and disposed on a peripheral edge of the limiting member 90'. The second guiding surface 91' and the second contact surface 92' may respectively be in contact with the first guiding surface 264' and the first contact surface 265'. The limiting hole 93' is disposed corresponding to the limiting hole H3' of the casing cover 11' and the through hole H4' of the shielding housing 14'. The sixth guiding rail portion 94' of the limiting member 90' is disposed corresponding to the fifth guiding rail portion 19'. The sixth guiding rail portion 94' has a fifth limiting portion IS' and a sixth limiting portion 16' opposite to each other. The fifth limiting portion IS' is closer to the second contact surface 92' than the sixth limiting portion 16'. The fifth guiding rail portion 19' may be moved between the fifth limiting portion IS' and the sixth limiting portion 16' of the sixth guiding rail portion 94'. In some embodiments, the fifth guiding rail portion 19' includes two side-by-side protruding posts. The sixth guiding rail portion 94' includes two side-by-side linear penetrating holes. In this way, the fifth guiding rail portion 19' is limited to move linearly between the fifth limiting portion 15' and the sixth limiting portion 16' of the sixth guiding rail portion 94'. One end of the second elastic member 71' is fixed to a side edge of the limiting member 90' that is away from the second contact surface 92', and another end of the second elastic member 71' is fixed to the casing cover 11'. In some embodiments, the second elastic member 71' may be a spring.

Figure 20:
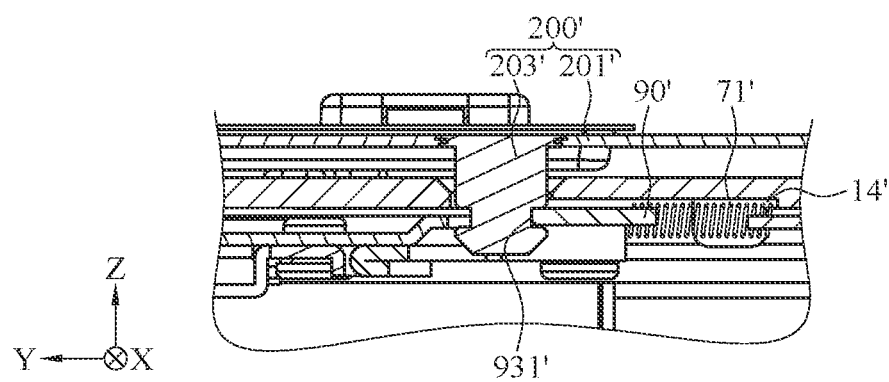
FIG. 20 illustrates a schematic partial cross-sectional view of the assembly module and the electronic device from a perspective of an indicator line G-G in FIG. 16, showing a status of the assembly module before operation.

FIG. 20 illustrates a schematic partial cross-sectional view of the assembly module 1' and the electronic device 200' (shown in FIG. 12) from a perspective of an indicator line G-G in FIG. 16, showing a status of the assembly module before operation. As shown in FIG. 16, in some embodiments, the limiting hole 93' has a first limiting hole end 931' and a second limiting hole end 932' opposite to each other. The second limiting hole end 932' is closer to the second contact surface 92' than the first limiting hole end 931'. In some embodiments, the limiting hole 93' is configured to be buckled with a buckle portion 203' of the electronic device 200' by using the first limiting hole end 931'. The second elastic member 71' is configured to provide a deformation energy for the limiting member 90', so that the limiting member 90' is buckled or unbuckled from the buckle portion 203'.

Figure 18:
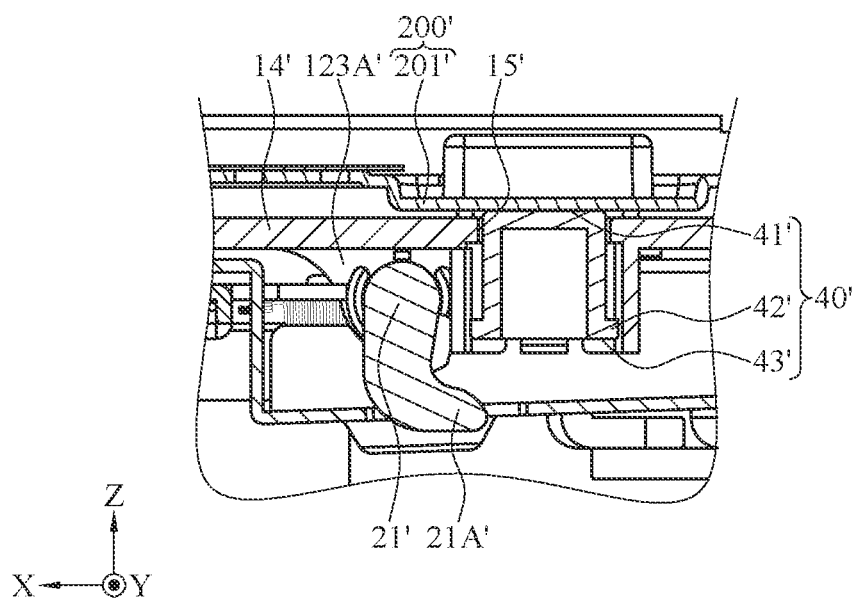
FIG. 18 illustrates a schematic partial cross-sectional view of the assembly module and the electronic device from a perspective of an indicator line B-B in FIG. 16, showing a status of the assembly module before operation.
Figure 19:
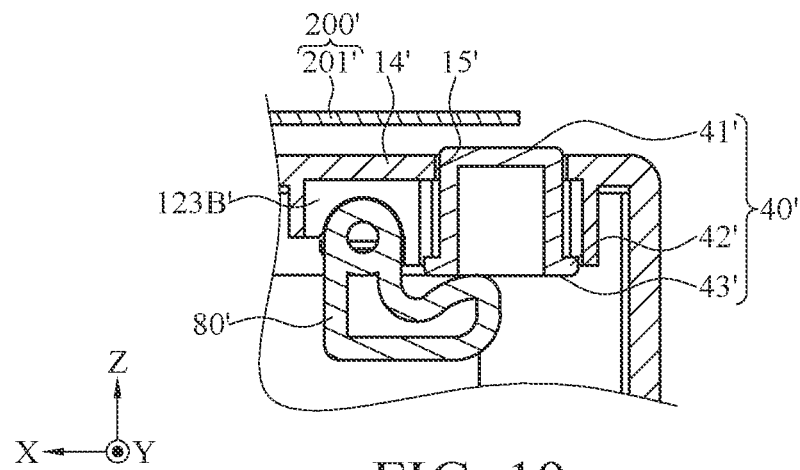
FIG. 19 illustrates a schematic partial cross-sectional view of the assembly module and the electronic device from a perspective of an indicator line F-F in FIG. 16, showing a status of the assembly module before operation.

FIG. 18 illustrates a schematic partial cross-sectional view of the assembly module 1' and the electronic device 200' (shown in FIG. 12) from a perspective of an indicator line B-B in FIG. 16, showing a status of the assembly module before operation. FIG. 19 illustrates a schematic partial cross-sectional view of the assembly module 1' and the electronic device 200' (shown in FIG. 12) from a perspective of an indicator line F-F in FIG. 16, showing a status of the assembly module before operation. Referring to FIG. 13, FIG. 14, FIG. 18, and FIG. 19, in some embodiments, the assembly module 1' includes pushers 40'. Each pusher 40' includes a limiting block 42' and a pushing surface 41' and a base surface 43' opposite to each other. The base surface 43' is closer to a groove bottom than the pushing surface 41'. The limiting block 42' is located between the pushing surface 41' and the base surface 43'. An area of the limiting block 42' is greater than an area of the penetrating hole 15'. The area of the penetrating hole 15' is greater than an area of each cross section located from the pushing surface 41' to the limiting block 42' in the pusher 40'. In this way, the pusher 40' may be inserted through the penetrating hole 15' without disengaging from the expansion equipment 100'. In some embodiments, an pusher 40' is accommodated in an accommodating space formed between the penetrating hole 15' and a groove bottom of the first groove E1'. Another pusher 40' is accommodated in an accommodating space formed between the penetrating hole 15' and a groove bottom of the second groove E2'. Still another pusher 40' is accommodated in an accommodating space formed between the penetrating hole 15' and a groove bottom of the third groove E3'.

As shown in FIG. 14 and FIG. 16, in some embodiments, a rotating member 80' may be disposed on the assembly module 1'. The rotating member 80' is pivotally connected to the third pivot member 123B' of the casing 10'. The rotating member 80' is disposed between the fourth force transfer portion 262' of the second force transfer rod 26' and one of the pushers 40'.

In some embodiments, as shown in FIG. 13 and FIG. 16, the operating member 30' of the assembly module 1' is located outside the casing 10', and is correspondingly disposed in an accommodating hole H1' of the casing 10'. The operating member 30' is connected to a first end 241' of the transmission rod 24'. In addition, based on the above connection relationship among the transmission rod 24', the first force transfer rod 25', the second force transfer rod 26', the rotary member 21', the connecting member 22', and the buckle member 23', when the operating member 30' is pushed, the transmission component 20' can be driven to operate. A configuration of the operating member 30' is same as the configuration of the operating member 30. Details are not described herein again.

Figure 21:
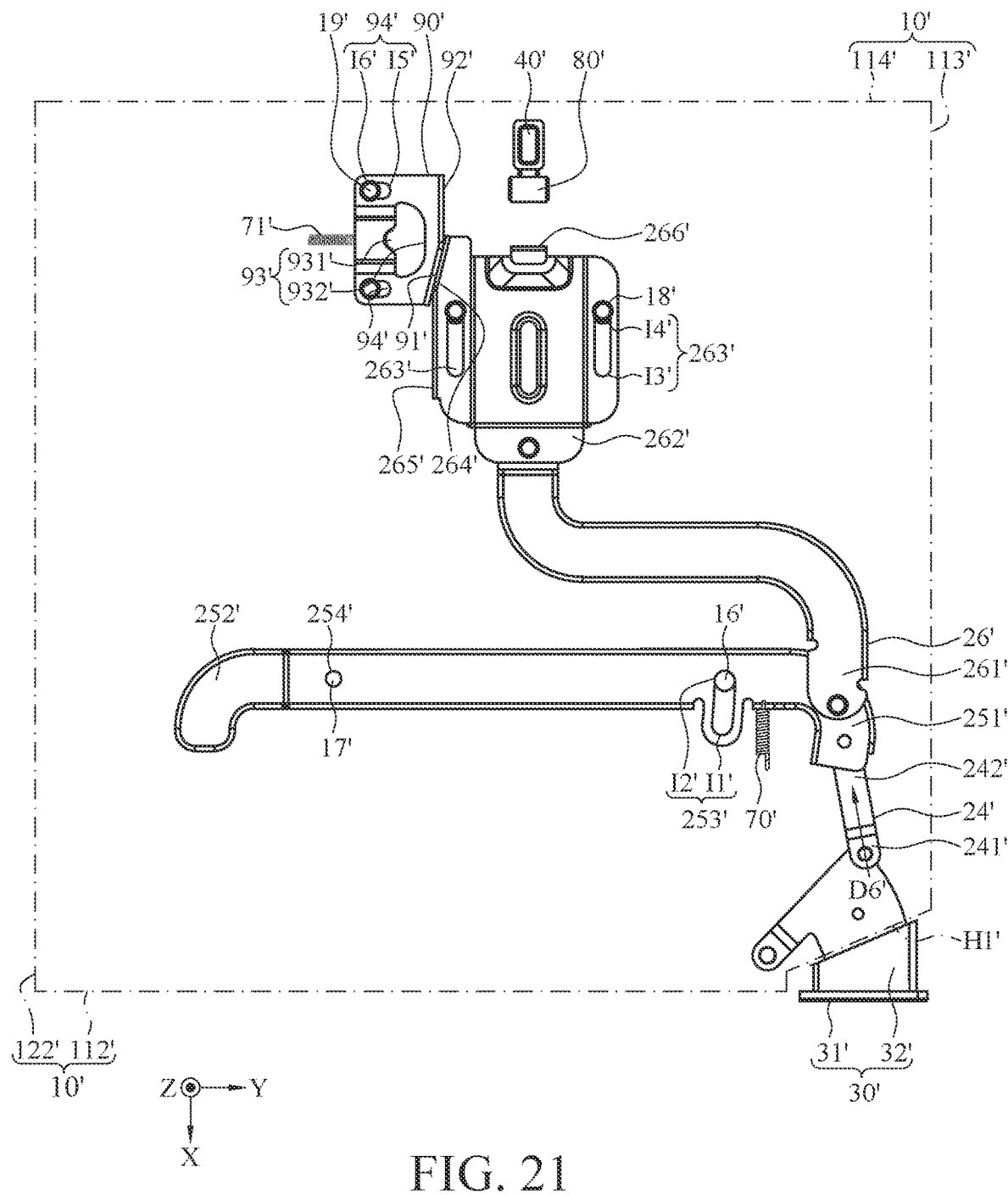
FIG. 21 illustrates a schematic top view of the expansion equipment according to some embodiments, in which partial components are omitted, and boundaries of the casing are marked by using dashed lines, showing a status of an operating member when not pressed.
Figure 22:
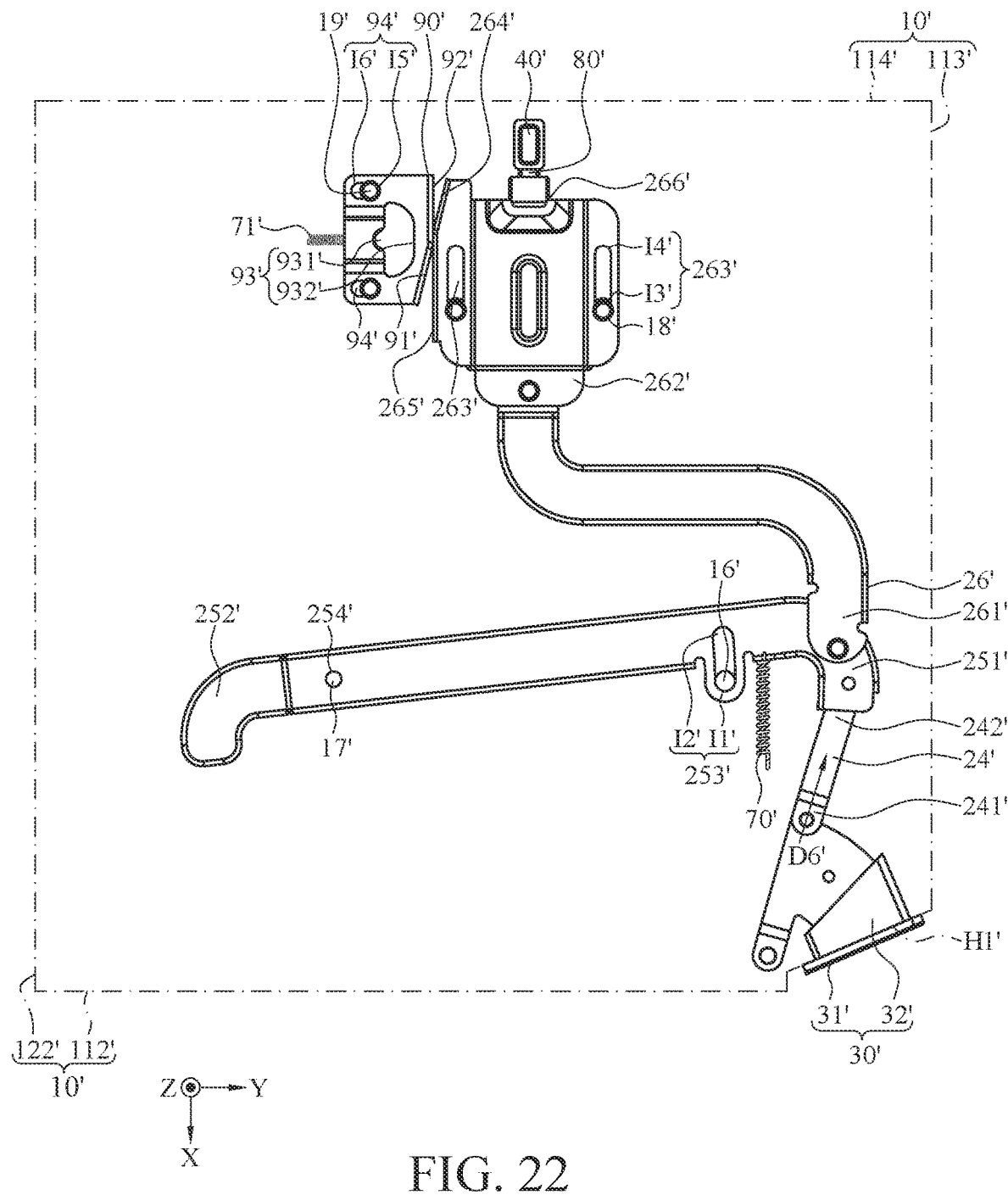
FIG. 22 illustrates another schematic top view of the expansion equipment according to some embodiments, in which partial components are omitted, and the boundaries of the casing are marked by using dashed lines, showing a status of the operating member when pressed.

FIG. 21 illustrates a schematic top view of the expansion equipment 100' (shown in FIG. 12) according to some embodiments, in which partial components are omitted, and boundaries of the casing 10' are marked by using dashed lines, showing a status of the operating member 30' when not pressed, where the operating member 30' is at an initial position in the status. FIG. 22 illustrates another schematic top view of the expansion equipment 100' (shown in FIG. 12) according to some embodiments, in which partial components are omitted, and boundaries of the casing 10' are marked by using dashed lines, showing a status of the operating member 30' when pressed, where the operating member 30' is at an operating position in the status. As shown in FIG. 13 to FIG. 22, when a user is to separate the expansion equipment 100' from the electronic device 200', the user may press the operating member 30', to move the operating member 30' from the initial position to the operating position. A connection relationship between the operating member 30' and the transmission component 20' is described below.

As shown in FIG. 21, when the operating member 30' is at the initial position, an operating portion 31' of the operating member 30' is a position farthest from the accommodating hole H1' of the casing 10'. The pushing portion 21A' of the rotary member 21' is away from the pushers 40', and the protruding block 22A' is away from buckle 231' of the buckle member 23'. In this case, the buckle member 23' is at the first position. The rotating member 80' is away from another pusher 40'. The first guiding rail portion 16' leans against the second limiting portion 12' of the second guiding rail portion 253' of the first force transfer rod 25'. The third guiding rail portion 18' leans against the fourth limiting portion 14' of the fourth guiding rail portion 263' of the second force transfer rod 26'. The fifth guiding rail portion 19' leans against the sixth limiting portion 16' of the sixth guiding rail portion 94' of the limiting member 90'. The second guiding surface 91' of the limiting member 90' is in contact with the first guiding surface 264' of the second force transfer rod 26'. The first limiting hole end 931' of the limiting member 90' is buckled with the buckle portion 203' of the electronic device 200' (referring to FIG. 16). The fourth force transfer portion 262' of the second force transfer rod 26' is away from the rotating member 80'.

As shown in FIG. 21 and FIG. 22, when the user applies an operating force to the operating portion 31', the operating member 30' is moved toward the accommodating hole H1', so that the transmission rod 24' fixedly connected to the operating member 30' is driven by the operating member 30' to move in a push direction D6', and generates a push force in the push direction D6'.

As shown in FIG. 13 and FIG. 22, the first force transfer portion 251' of the first force transfer rod 25' is connected to the second end 242' of the transmission rod 24', and the first force transfer rod 25' is pivotally connected to the first connected portion 17' of the casing cover 11' by using the second connected portion 254'. Therefore, the first force transfer rod 25' converts the push force delivered by the transmission rod 24' to a torque, so that the first force transfer rod 25' is rotated by using the first connected portion 17' as an axis. The second force transfer portion 252' of the first force transfer rod 25' comes into contact with and pushes the rotary member 21', to accumulate a deformation energy for the first elastic member 70' which close to the first force transfer portion 251'. In addition, the first limiting portion IF of the second guiding rail portion 253' is moved toward the first guiding rail portion 16'.

Figure 23:
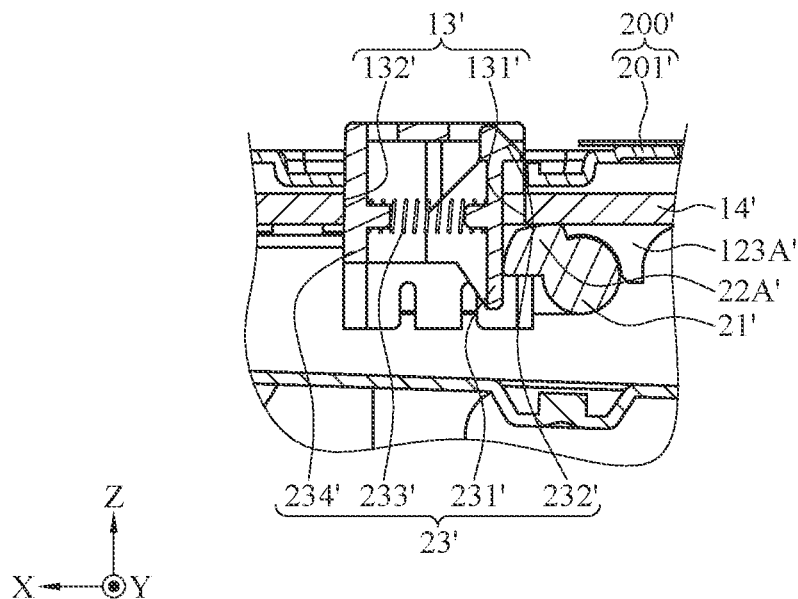
FIG. 23 illustrates a schematic partial cross-sectional view of the assembly module and the electronic device from the perspective of the indicator line A-A in FIG. 16, showing a status of the assembly module during operation.
Figure 24:
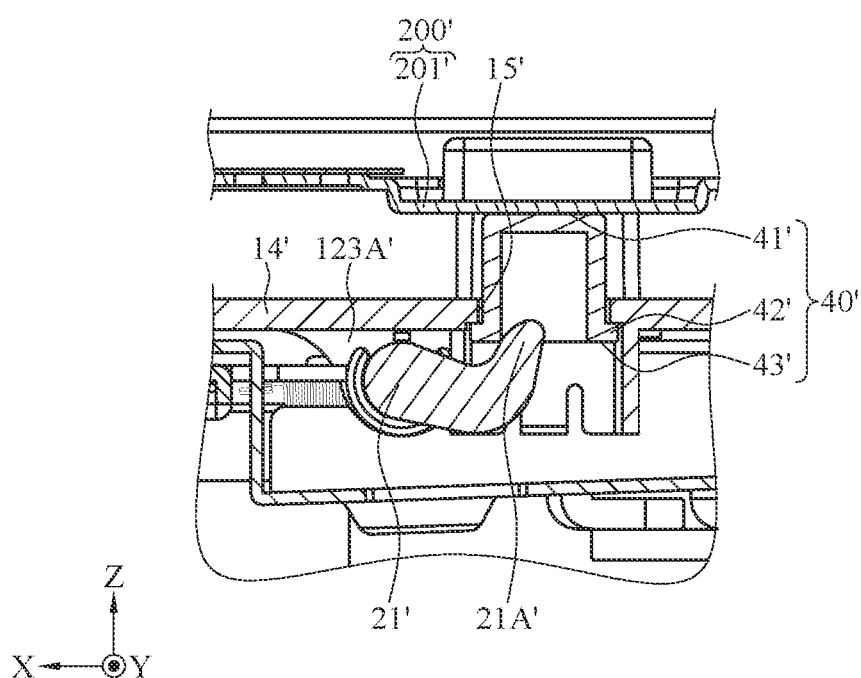
FIG. 24 illustrates a schematic partial cross-sectional view of the assembly module and the electronic device from the perspective of the indicator line B-B in FIG. 16, showing a status of the assembly module during operation.

FIG. 23 illustrates a schematic partial cross-sectional view of the assembly module 1' and the electronic device 200' (shown in FIG. 12) from the perspective of the indicator line A-A in FIG. 16, showing a status of the assembly module during operation. FIG. 24 illustrates a schematic partial cross-sectional view of the assembly module 1' and the electronic device 200' (shown in FIG. 12) from the perspective of the indicator line B-B in FIG. 16, showing a status of the assembly module during operation. As shown in FIG. 16 to FIG. 24, the rotary member 21' generates a torque after receiving the push force from the second force transfer portion 252', so that the rotary member 21' is rotated in the axial direction of the second pivot member 123A', and the connecting member 22' of the rotary member 21' is rotated toward the buckle 231' of the buckle member 23', to push the buckle 231', so that the buckle 231' is pushed toward the fixing base 234'. Thus, the restoration member 233' is squeezed to deform. At the same time, the pushing portion 21A' of the rotary member 21' is rotated toward the base surface 43' of the pusher 40', to push the base surface 43', so that the pusher 40' can be protruded out of the penetrating hole 15' and push the housing 201' of the electronic device 200', so as to separate the electronic device 200' from the expansion equipment 100'.

Figure 25:
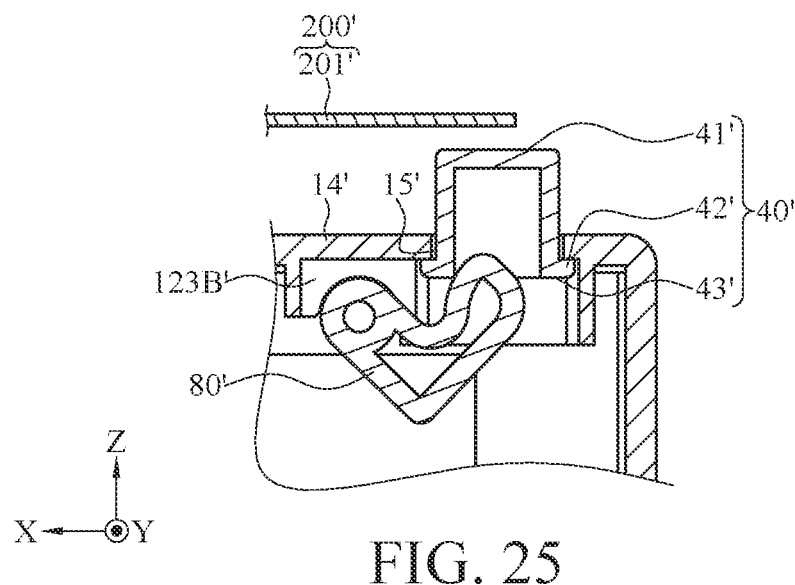
FIG. 25 illustrates a schematic partial cross-sectional view of the assembly module and the electronic device from the perspective of the indicator line F-F in FIG. 16, showing a status of the assembly module during operation.
Figure 26:
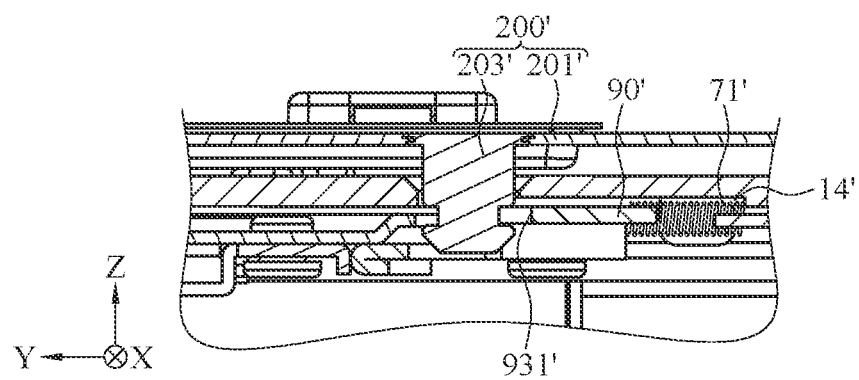
FIG. 26 illustrates a schematic partial cross-sectional view of the assembly module and the electronic device from the perspective of the indicator line G-G in FIG. 16, showing a status of the assembly module during operation.

FIG. 25 illustrates a schematic partial cross-sectional view of the assembly module 1' and the electronic device 200' (shown in FIG. 12) from the perspective of the indicator line F-F in FIG. 16, showing a status of the assembly module during operation. FIG. 26 illustrates a schematic partial cross-sectional view of the assembly module 1' and the electronic device 200' (shown in FIG. 12) from the perspective of the indicator line G-G in FIG. 16, showing a status of the assembly module during operation. As shown in FIG. 16 to FIG. 26, since the third force transfer portion 261' of the second force transfer rod 26' is connected to the transmission rod 24' by using the first force transfer rod 25', when the transmission rod 24' is moved by the operating force, the second force transfer rod 26' can be driven to move. In this case, the fourth force transfer portion 262' is moved toward the rotating member 80', the push surface 266' of the fourth force transfer portion 262' pushes the rotating member 80', so that the rotating member 80' can be rotated in the axial direction of the third pivot member 123B', thereby pushing the pusher 40'. In this way, the pusher 40' can protrude out of the penetrating hole 15' and push the housing 201' of the electronic device 200'. At the same time, the first guiding surface 264' of the second force transfer rod 26' guides the second guiding surface 91' of the limiting member 90', so that the first contact surface 265' comes into contact with the second contact surface 92', thereby driving the fifth limiting portion IS' of the sixth guiding rail portion 94' of the limiting member 90' to move toward the fifth guiding rail portion 19'. Therefore, the limiting member 90' squeezes the second elastic member 71' to generate a deformation energy. In this case, the first limiting hole end 931' of the limiting hole 93' is away from the buckle portion 203' of the electronic device 200'.

As shown in FIG. 22, the operating force is continuously applied to the operating member 30'. When the operating portion 31' of the operating member 30' is at a position closest to the accommodating hole H1' of the casing 10', the operating member 30' is at the operating position. In this case, referring to FIG. 16 to FIG. 23 together, the transmission rod 24' drives the rotary member 21' to move the buckle member 23' between a first position and a second position (for example, the buckle member 23' is moved from the first position in FIG. 17 to the second position in FIG. 23). In this case, the first limiting portion IF of the second guiding rail portion 253' leans against the first guiding rail portion 16'. The third limiting portion 13' of the fourth guiding rail portion 263' leans against the third guiding rail portion 18'.

The fifth limiting portion IS' of the sixth guiding rail portion 94' leans against the fifth guiding rail portion 19'. As shown in FIG. 23 and FIG. 26, when the buckle member 23' is at the second position, a gap is formed between the buckle 231' of the buckle member 23' and the snapping surface 131'. The gap is generated after the buckle 231' is moved in an unbuckling direction (for example, the buckle 231' is moved toward a left side of FIG. 23). In this way, the buckle part 232' is unbuckled from the housing 201' of the electronic device 200' (as shown in FIG. 23, the buckle part 232' escapes from an upper surface of the housing 201', and the housing 201' and the buckle part 232' are not in contact with each other). A gap is also formed between the buckle portion 203' of the electronic device 200' and the limiting member 90', so that the electronic device 200' can be disassembled from the assembly module 1'. At the same time, as shown in FIG. 24, the pushing surface 41' of the pusher 40' pushes the housing 201' of the electronic device 200', so that the housing 201' is disengaged from the buckle part 232' of the buckle member 23'. In addition, since the area of the limiting block 42' of the pusher 40' is greater than the area of the penetrating hole 15', the limiting block 42' can be limited in the penetrating hole 15' of the casing 10', so that the pusher 40' is prevented from being disengaged from the casing 10' through the penetrating hole 15' during the above operation.

Based on the above, referring to FIG. 16 to FIG. 26 together, when the operating force applied to the operating member 30' is released, the first elastic member 70', the second elastic member 71', and the restoration member 233' release the deformation energy accumulated in the above process. In this way, the buckle member 23' returns from the second position to the first position, and the first guiding rail portion 16' leans against the second limiting portion 12' of the second guiding rail portion 253' of the first force transfer rod 25'. The third guiding rail portion 18' leans against the fourth limiting portion 14' of the fourth guiding rail portion 263' of the second force transfer rod 26'. The fifth guiding rail portion 19' leans against the sixth limiting portion 16' of the sixth guiding rail portion 94' of the limiting member 90'. The second guiding surface 91' of the limiting member 90' is in contact with the first guiding surface 264' of the second force transfer rod 26'. The operating member 30' returns from the operating position to the initial position.

In summary, according to some embodiments, by means of the assembly module, the operating member outside the casing is switched to the initial position or the operating position, so that the operating member drives the transmission rod of the transmission component, the transmission rod drives the rotary member, the rotary member drives the connecting member, and the connecting member drives the buckle member. In this way, the transmission rod drives the buckle member to move to the first position or the second position, so that the assembly module can perform assembling or disassembling. Therefore, a user can perform assembling or disassembling without operating inside the casing. In this way, the disassembling/assembling process is simplified. In addition, by means of the assembly module, the expansion equipment can be assembled to the housing of the electronic device. Thus, the electronic device does not need to provide additional space to accommodate electronic apparatuses, thereby achieving the thinning, the miniaturization, and the lightweight of the electronic device.

What is claimed is:

1. An expansion equipment, comprising:
a casing, provided with a buckle hole; and
an assembly module, comprising:
a transmission component, disposed in the casing and comprising a rotary member, a connecting member, and a buckle member, wherein the rotary member is pivotally connected to the casing, the connecting member is connected between the rotary member and the buckle member, and a part of the buckle member is exposed from the buckle hole; and
an operating member, disposed on the casing and connected to the transmission component;
wherein the operating member is configured to drive the transmission component, so that the part of the buckle member is movably disposed in the buckle hole.

2. The expansion equipment according to claim 1, wherein the transmission component further comprises a transmission rod connected between the operating member and the rotary member, and the operating member is configured to drive the transmission rod, so that the transmission rod drives the rotary member, the connecting member, and the buckle member to operate.

3. The expansion equipment according to claim 2, wherein the transmission component further comprises a moment arm rod fixedly connected between the transmission rod and the rotary member.

4. The expansion equipment according to claim 1, wherein the operating member is configured to move between an initial position and an operating position, the buckle member is configured to move between a first position and a second position, and during movement of the operating member from the initial position to the operating position, the operating member drives the transmission component to operate, and the buckle member is moved from the first position to the second position.

5. The expansion equipment according to claim 4, wherein the buckle hole has a snapping surface, when the buckle member is at the first position, a part of the buckle member is close to the snapping surface, or when the buckle member is at the second position, the part of the buckle member is away from the snapping surface.

6. The expansion equipment according to claim 4, wherein the rotary member is a rotary disc, the connecting member comprises a link, two ends of the link are respectively pivotally connected to the rotary disc and the buckle member, and when the operating member drives the rotary member to rotate, the rotary member drives the link, so that the link drives the buckle member to move from the first position to the second position.

7. The expansion equipment according to claim 4, wherein the assembly module further comprises a torsion spring fixedly connected between the rotary member and the casing.

8. The expansion equipment according to claim 4, wherein the rotary member is a rotary shaft, the connecting member is formed by extending outwardly from a radial surface of the rotary shaft, when the operating member drives the rotary member to rotate, the connecting member is driven to push against the buckle member, so that the buckle member is moved from the first position to the second position.

9. The expansion equipment according to claim 8, wherein the transmission component further comprises a first force transfer rod connected between the operating member and the rotary member, and the first force transfer rod is configured to push against the rotary member, and drive the buckle member to move between the first position and the second position.

10. The expansion equipment according to claim 9, wherein the assembly module further comprises a first elastic member disposed between the casing and the first force transfer rod.

11. The expansion equipment according to claim 8, wherein the assembly module further comprises a pusher, the casing further comprises a penetrating hole, the pusher is inserted through the penetrating hole, and the rotary shaft comprises a pushing portion configured to push against the pusher.

12. The expansion equipment according to claim 8, wherein the assembly module further comprises a pusher and a rotating member, the casing further comprises a penetrating hole, the transmission component further comprises a second force transfer rod, the pusher is inserted through the penetrating hole, the rotating member is close to the pusher, one end of the second force transfer rod is connected to the operating member, an other end of the second force transfer rod is close to the rotating member, and the second force transfer rod is configured to push against the rotating member.

13. The expansion equipment according to claim 12, wherein the transmission component further comprises a limiting member and a second elastic member, the second elastic member is disposed between the casing and the limiting member, and the limiting member is in contact with the other end of the second force transfer rod, and is configured to be pushed by the second force transfer rod toward the second elastic member.

14. The expansion equipment according to claim 13, wherein the second force transfer rod comprises a first guiding surface, and the limiting member comprises a second guiding surface disposed corresponding to the first guiding surface.

15. The expansion equipment according to claim 13, wherein the expansion equipment is configured to be combined with an electronic device, a buckle portion is disposed on the electronic device, a through hole is provided in the casing corresponding to the buckle portion, the buckle portion is disposed corresponding to the limiting member, and the limiting member is configured to be buckled with the buckle portion.

16. The expansion equipment according to claim 1, wherein the assembly module further comprises a pusher movably inserted through a penetrating hole of the casing, the casing further comprises a cantilever support, and an elastic member is connected between the pusher and the cantilever support.

17. The expansion equipment according to claim 1, wherein the transmission component further comprises a transmission rod connected between the operating member and the rotary member, and the operating member is configured to drive the transmission rod, so that the transmission rod drives the rotary member, the connecting member, and the buckle member to operate; the operating member is configured to move between an initial position and an operating position, the buckle member is configured to move between a first position and a second position, and during movement of the operating member from the initial position to the operating position, the operating member drives the transmission component to operate, and the buckle member is moved from the first position to the second position; the buckle hole has a snapping surface, when the buckle member is at the first position, a part of the buckle member is close to the snapping surface, or when the buckle member is at the second position, the part of the buckle member is away from the snapping surface; the rotary member is a rotary disc, the connecting member comprises a link, two ends of the link are respectively pivotally connected to the rotary disc and the buckle member, when the operating member drives the rotary member to rotate, the rotary member drives the link, so that the link drives the buckle member to move from the first position to the second position; the assembly module further comprises a pusher movably extending through a penetrating hole of the casing, the casing further comprises a cantilever support, and an elastic member is connected between the pusher and the cantilever support; the transmission component further comprises a moment arm rod fixedly connected between the transmission rod and the rotary disc; and the assembly module further comprises a torsion spring fixedly connected between the rotary disc and the casing.

18. The expansion equipment according to claim 1, wherein the rotary member is a rotary shaft, the connecting member is formed by extending outwardly from a radial surface of the rotary shaft, and when the operating member drives the rotary member to rotate, the connecting member is driven to push against the buckle member, so that the buckle member is moved from a first position to a second position; the transmission component further comprises a first force transfer rod connected between the operating member and the rotary member, and the first force transfer rod is configured to push against the rotary member, and drive the buckle member to move between the first position and the second position; the assembly module further comprises a first elastic member disposed between the casing and the first force transfer rod; the assembly module further comprises a pusher, the casing further comprises a penetrating hole, the pusher is inserted through the penetrating hole, and the rotary shaft comprises a pushing portion configured to push against the pusher; the assembly module further comprises another pusher and a rotating member, the casing further comprises another penetrating hole, the transmission component further comprises a second force transfer rod, the another pusher is inserted through the another penetrating hole, the rotating member is close to the another pusher, one end of the second force transfer rod is connected to the operating member, an other end of the second force transfer rod is close to the rotating member, and the second force transfer rod is configured to push against the rotating member; the transmission component further comprises a limiting member and a second elastic member, the second elastic member is disposed between the casing and the limiting member, and the limiting member is in contact with the other end of the second force transfer rod, and is configured to be pushed by the second force transfer rod toward the second elastic member; the second force transfer rod comprises a first guiding surface, and the limiting member comprises a second guiding surface disposed corresponding to the first guiding surface; and the expansion equipment is configured to be combined with an electronic device, a buckle portion is disposed on the electronic device, a through hole is provided in the casing corresponding to the buckle portion, the buckle portion is disposed corresponding to the through hole and the limiting member, and the limiting member is configured to be buckled with the buckle portion.

19. An assembly module, applicable to a casing, wherein a buckle hole is provided in the casing, the assembly module comprising:
  a transmission component, disposed in the casing and comprising a rotary member, a connecting member, and a buckle member, wherein the rotary member is pivotally connected to the casing, the connecting member is connected between the rotary member and the buckle member, and a part of the buckle member is exposed from the buckle hole; and an operating member, disposed on the casing and connected to the transmission component, wherein the operating member is configured to drive the transmission component, so that a part of the buckle member is movably disposed in the buckle hole.

\* \* \* \* \*